(12) United States Patent
Masuda

(10) Patent No.: US 6,576,498 B2
(45) Date of Patent: Jun. 10, 2003

(54) SEMICONDUCTOR DEVICE AND A METHOD OF MANUFACTURING THE SAME

(75) Inventor: Masachika Masuda, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/977,229

(22) Filed: Oct. 16, 2001

(65) Prior Publication Data

US 2002/0017722 A1 Feb. 14, 2002

Related U.S. Application Data

(63) Continuation of application No. 09/657,581, filed on Sep. 8, 2000.

(30) Foreign Application Priority Data

Sep. 22, 1999 (JP) ............................................ 11-268731

(51) Int. Cl.⁷ .......................... H01L 21/44; H01L 21/48; H01L 21/50
(52) U.S. Cl. ....................................... 438/123; 438/127
(58) Field of Search ................................. 438/106, 118, 438/123, 124, 125, 126, 112, 122, 127

(56) References Cited

U.S. PATENT DOCUMENTS

| | | |
|---|---|---|
| 5,585,665 A | 12/1996 | Anjoh et al. |
| 6,087,722 A | 7/2000 | Lee et al. |
| 6,118,184 A * | 9/2000 | Ishio et al. |
| 6,153,922 A | 11/2000 | Sugiyama et al. |
| 6,215,192 B1 | 4/2001 | Hirata et al. |
| 6,252,299 B1 | 6/2001 | Masuda et al. |
| 6,335,227 B1 * | 1/2002 | Tsubosaki et al. |

FOREIGN PATENT DOCUMENTS

| | | |
|---|---|---|
| JP | 5-82719 | 4/1993 |
| JP | 7-58281 | 3/1995 |
| JP | 10-506226 | 6/1998 |

* cited by examiner

*Primary Examiner*—David Nelms
*Assistant Examiner*—Phuc T. Dang
(74) *Attorney, Agent, or Firm*—Mattingly, Stanger & Malur, P.C.

(57) ABSTRACT

Two semiconductor chips sealed with a mold resin are stacked on each other so that their backs are opposite to each other. The two semiconductor chips are supported by suspension leads fixedly secured to a circuit forming surface (lower surface) of the lower chip. A pair of bus bar leads is placed in the vicinity of the sides of these chips, and a plurality of leads are placed thereoutside. Wires are bonded between one surfaces of both the bus bar leads and the leads and one of the two semiconductor chips. Further, wires are bonded between the other surfaces of both the bus bar leads and the leads and the other of the semiconductor chips. Thus, a semiconductor device wherein the two semiconductor chips are laminated and sealed with a resin, is reduced in manufacturing cost, and the thinning of the present semiconductor device is pushed forward.

5 Claims, 24 Drawing Sheets

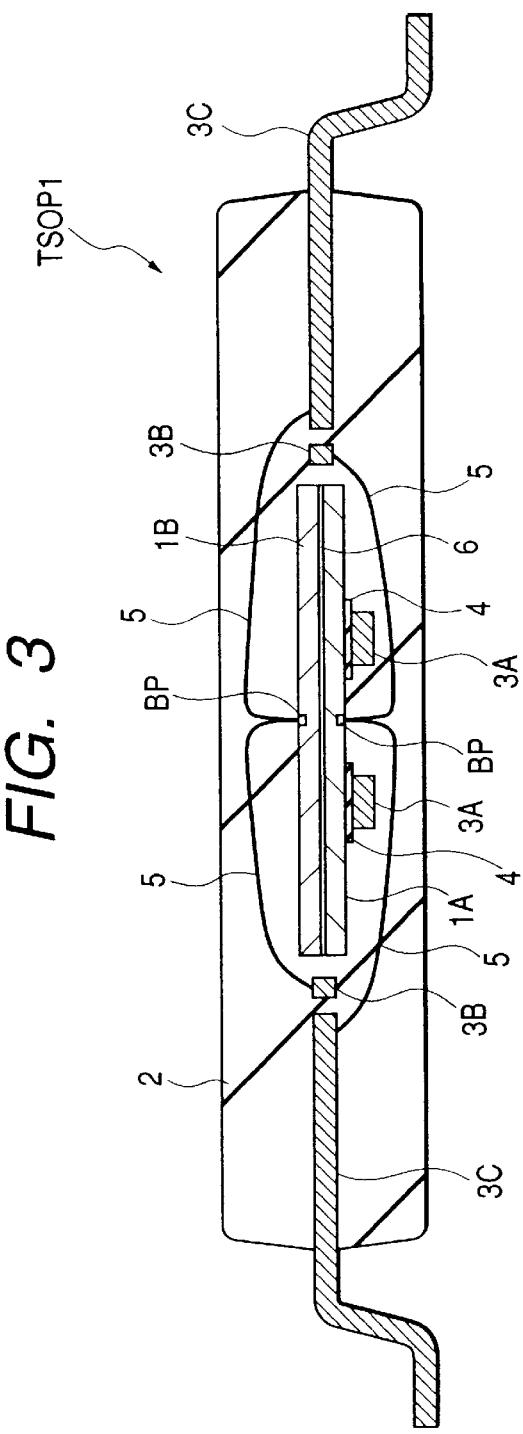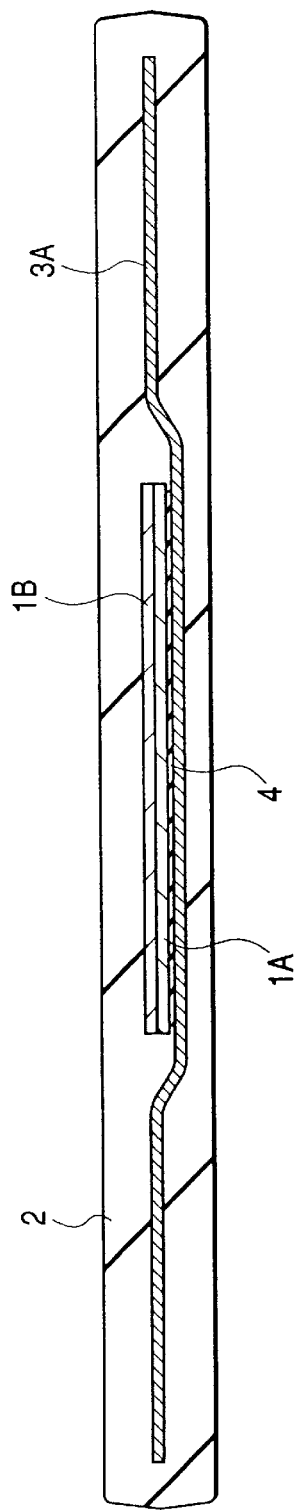

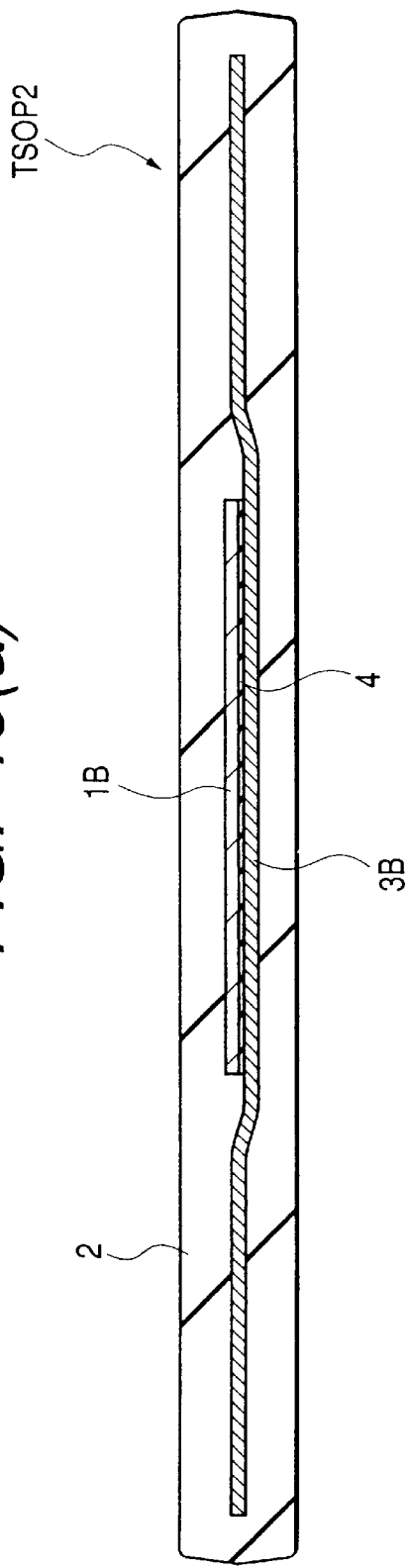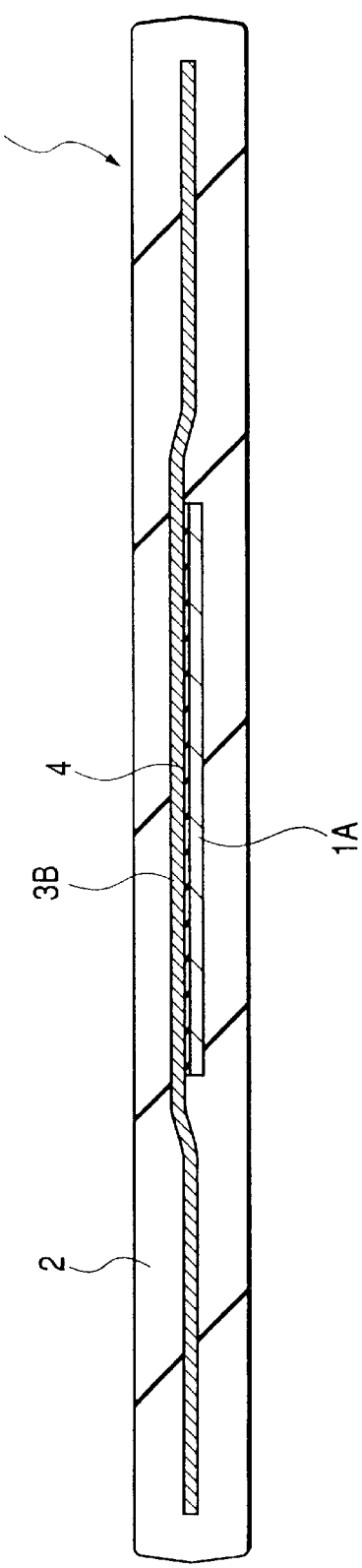

SEMICONDUCTOR DEVICE AND A METHOD OF MANUFACTURING THE SAME

This is a continuation application of U.S. Ser. No. 09/657,581 filed Sep. 8, 2000, now allowed.

BACKGROUND OF THE INVENTION

The present invention relates to a semiconductor device and a technology for manufacturing the same, and particularly to a technology effective for application to a semiconductor device wherein two semiconductor chips are laminated and sealed with a resin.

A resin encapsulation type semiconductor device aimed at implementing each semiconductor chip in high density, in which a memory LSI such as a DRAM (Dynamic Random Access Memory), an SRAM (Static Random Access Memory) or the like is formed, has been described in Japanese Patent Application Laid-Open No. Hei 7 (1995)-58281.

The resin encapsulation type semiconductor device described in the publication comprises an SOJ (Small Outline J-leaded) type package. In the semiconductor device, two semiconductor chips in which memory LSIs each having the same storage capacity are formed, are encapsulated inside a resin encapsulator formed by a transfer mold method, in a state in which they are laminated up and down.

The two semiconductor chips are placed in such a manner that their element forming surfaces are opposed to each other. Inner lead portions of a plurality of leads are placed on their corresponding circuit forming surfaces with insulating films interposed therebetween. Namely, the present resin encapsulation type semiconductor device is comprised of an LOC (Lead On Chip) structure wherein inner lead portions are placed on a circuit forming surface of each semiconductor chip. The respective inner lead portions are electrically connected to their corresponding bonding pads of each semiconductor chip through wires.

One of the two semiconductor chips is resin-encapsulated in a state of being fixed to leads of a first lead frame, whereas the other thereof is resin-encapsulated in a state of being fixed to leads of a second lead frame. Namely, the resin encapsulation type semiconductor device is manufactured by the two lead frames.

The inner lead portions of the leads connected to one of the two semiconductor chips, and the inner lead portions of the leads connected to the other thereof are bent in the direction in which they approach each other inside the resin encapsulator. Further, they are weld-bonded to one another by laser. The other ends of the leads connected to one semiconductor chip, of these leads are drawn outside from the sides of the resin encapsulator and constitute outer lead portions. On the other hand, since the other ends of the leads connected to the other semiconductor chip are subjected to the weld bonding process by the laser and thereafter cut off inside the resin encapsulator prior to a transfer mold process, they are not drawn outside the resin encapsulator. Namely, the outer lead portions drawn from the resin encapsulator constitute external connecting terminals common to the two semiconductor chips.

Incidentally, the present inventors have examined the references known to date after the completion of the present invention. As a result, the present inventors have further found Japanese Patent Application Laid-Open Nos. Hei 5(1993)-82719 and 10(1998)-506226 as prior arts other than the above, each of which relates to a semiconductor device wherein two semiconductor chips are laminated and encapsulated inside a resin encapsulator. However, a lead frame structure employed in a semiconductor device of the present invention to be described later in detail has not been described even in both of these publications.

SUMMARY OF THE INVENTION

Since the SOJ type package described in Japanese Patent Application Laid-Open No. Hei 7(1995)-58281, wherein the first semiconductor chip fixed to the leads of the first lead frame and the second semiconductor chip fixed to the leads of the second lead frame are laminated and sealed with the resin, makes use of the two lead frames, the number of members increases as compared with the normal SOJ type package using one lead frame, and the manufacturing cost of the package increases correspondingly.

Further, since the SOJ type package adopts the LOC structure wherein the inner lead portions of the first lead frame are placed on the circuit forming surface of the first semiconductor chip, and the inner lead portions of the second lead frame are placed on the circuit forming surface of the second semiconductor chip, it is difficult to reduce the thickness of the resin encapsulator in the direction in which the semiconductor chips are laminated.

An object of the present invention is to provide a technology for reducing the manufacturing cost of a semiconductor device wherein two semiconductor chips are stacked on each other and sealed with a resin.

Another object of the present invention is to provide a technology for promoting a reduction in the thickness of a semiconductor device wherein two semiconductor chips are laminated and sealed with a resin.

The above, and other objects and novel features of the present invention will become apparent from the description of the present specification and the accompanying drawings.

Summaries of typical ones of the inventions disclosed in the present application will be described in brief as follows:

There is provided a semiconductor device according to the present invention, which comprises first and second semiconductor chips laminated so as to oppose backs thereof to each other, fixed potential leads placed in the vicinity of sides of the first and second semiconductor chips, a plurality of signal leads, a plurality of bonding pads formed over a main surface of the first semiconductor chip, a plurality of bonding pads formed over a main surface of the second semiconductor chip, and a plurality of wires, and wherein one surfaces of the plurality of signal leads and the fixed potential lead, and the plurality of bonding pads formed over the main surface of the first semiconductor chip are respectively electrically connected to one another by the plurality of wires, the other surfaces of the plurality of signal leads and the fixed potential lead, and the plurality of bonding pads formed over the main surface of the second semiconductor chip are respectively electrically connected to one another by the plurality of wires, and the first and second semiconductor chips, the plurality of signal leads, the fixed potential leads, and the plurality of wires are sealed with a resin.

In the semiconductor device according to the present invention as well, suspension leads for respectively supporting the first and second semiconductor chips are fixedly secured to the main surface of either one of the first and second semiconductor chips.

Further, in the semiconductor device according to the present invention, the first and second semiconductor chips are placed in opposing relationship with being mutually shifted in positions so as to avoid the overlapping of parts of the backs thereof, one part of the fixed potential lead is fixedly secured to the non-overlapping area of the back of the first semiconductor chip, and the other part of the fixed potential lead is fixedly secured to the non-overlapping area of the back of the second semiconductor chip.

Furthermore, in the semiconductor device according to the present invention, parts of the fixed potential leads are interposed between the first and second semiconductor chips and fixedly secured to the backs thereof, and the other parts of the fixed potential leads extend outwardly from the sides of the first and second semiconductor chips.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 is a cross-sectional view of the semiconductor device taken along line III—III of FIG.

FIG. 4 is a cross-sectional view of the semiconductor device taken along line IV—IV of FIG. 1;

FIGS. 19(a) and 19(b) are respectively cross-sectional views of the semiconductor device according to the embodiment 2 of the present invention;

DESCRIPTION OF THE PREFERRED EMBODIMENTS

Figure 1:
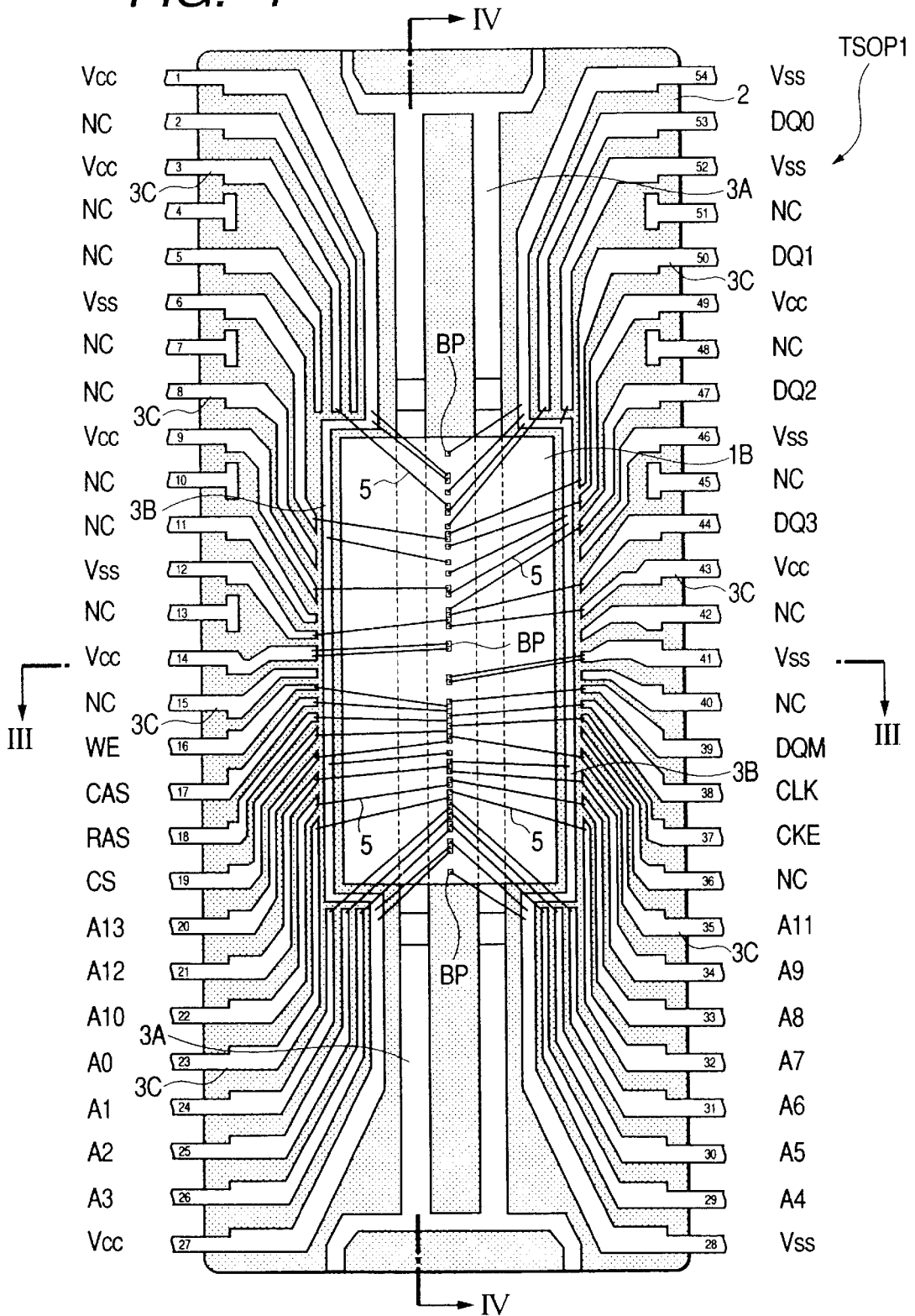
FIG. 1 is a plan view showing an upper surface of a semiconductor device according to an embodiment 1 of the present invention.

Preferred embodiments of the present invention will hereinafter be described in detail with reference to the accompanying drawings. Incidentally, the same components or members shown in all the drawings for describing the embodiments are identified by like reference numerals and their repetitive description will therefore be omitted.

Embodiment 1

Figure 2:
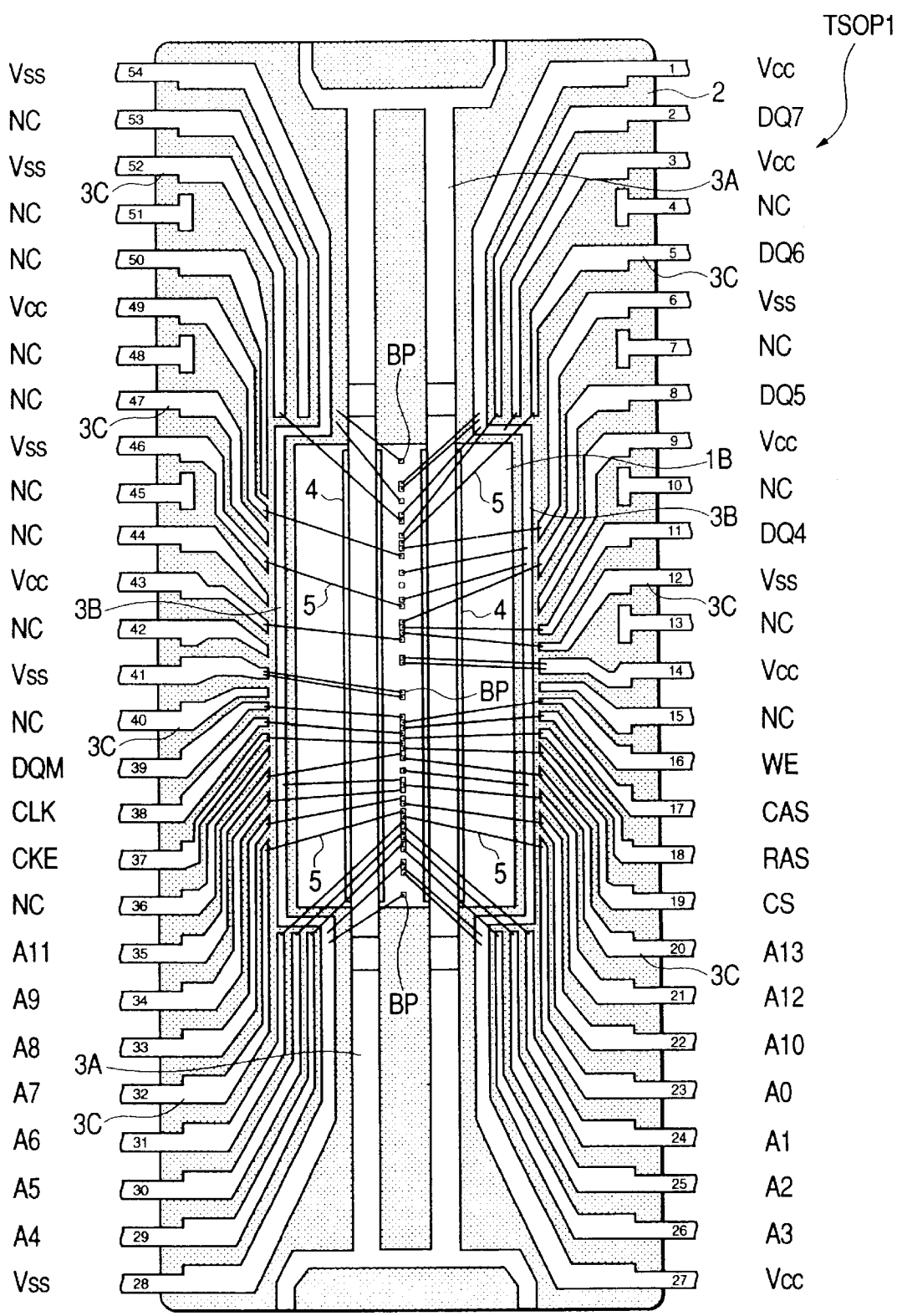
FIG. 2 is a plan view illustrating a lower surface of the semiconductor device according to the embodiment 1 of the present invention.

FIG. 1 is a plan view showing an upper surface of a semiconductor device according to the present embodiment in a state in which part of a mold resin has been removed, FIG. 2 is a plan view illustrating a lower surface (mounting surface) of the semiconductor device in a state in which part of the mold resin has been removed, FIG. 3 is a cross-sectional view taken along a transverse direction of the semiconductor device (along line III—III of FIG. 1), and FIG. 4 is a cross-sectional view taken along a longitudinal direction of the same semiconductor device (along line IV—IV of FIG. 1), respectively.

The semiconductor device according to the present embodiment is a TSOP (Thin Small Out-line Package) wherein two semiconductor chips (hereinafter called simply "chips") 1A and 1B are stacked on each other and sealed with a mold resin 2. A plan form of the TSOP1 is rectangular, the width thereof (corresponding to the transverse length thereof) is 400 mil, for example, and the thickness thereof is 1 mm, for example.

The two chips 1A and 1B sealed with the mold resin 2 are stacked on each other so that their reverse sides or backs are opposite to each other. Namely, the lower chip (first semiconductor chip) 1A has a lower surface used as a circuit forming surface (main surface) and the upper chip (second semiconductor chip) 1B has an upper surface used as a circuit forming surface (main surface). The back of the chip 1A and the back of the chip 1B are fixed to each other by an adhesive 6.

The two chips 1A and 1B are rectangular monocrystal silicon chips having the same outside dimensions. A DRAM having a word×bit configuration of 64 mega bits (Mbit)×4 bits (bit), for example, is formed on each of the circuit forming surfaces. Namely, the TSOP1 according to the present embodiment implements a large capacity DRAM package having a word×bit configuration of 128 Mbit×8 bit by stacking the same kinds of DRAM chips 1A and 1B each having the word×bit configuration of 64 Mbit×4 bit on each other and sealing these with the mold resin 2.

A plurality of bonding pads BP (external or outer terminals) arranged in one rows along the longitudinal directions of the chips 1A and 1B are respectively formed in central portions of the circuit forming surfaces of the two chips 1A and 1B. Namely, these chips 1A and 1B respectively adopt a center pad system for placing or laying out the bonding pads BP in the central portions of the circuit forming surfaces. The two chips 1A and 1B are stacked on each other in a state in which the circuit forming surface of one chip 1A and the circuit forming surface of the other chip 1B are mirror-reversed each other with the bonding pad BP arrays as symmetric axes respectively.

The two chips 1A and 1B are supported by two hang or suspension leads 3A and 3A extending in parallel along their longitudinal directions and placed in the internal center of the mold resin 2. These hand leads 3A are fixedly secured to the circuit forming surface (lower surface) of the lower chip 1A with insulating films 4 comprised of a heat-resistance resin such as polyimide whose both surfaces are coated with an adhesive (not shown) being interposed therebetween. As shown in FIG. 4, parts of the suspension leads 3A are bent downward in the vicinity of the short sides of the chips 1A and 1B to substantially uniformize the thickness of the mold resin 2 at an upper portion of the upper chip 1B and a lower portion of the lower chip 1A.

A plurality of bus bar leads (fixed potential leads) 3B and leads (signal leads) 3C, which constitute external or outer connecting terminals of the TSOP1, are provided on the side faces of the two long sides of the mold resin 2. The bus bar leads 3B and the leads 3C respectively extend over inner and outer ranges of the mold resin 2. Inner portions of the mold resin 2 are called "inner lead portions", and outer portions thereof are called "outer lead portions", respectively.

As shown in FIGS. 1 and 2, terminal numbers of No. 1 to No. 54 are assigned to the outer lead portions of the bus bar leads 3B and leads 3C. When the TSOP1 is viewed from above (see FIG. 1), the bus bar lead 3B at the top of a row provided on the left side corresponds to the first terminal. Subsequently, the number increases sequentially in a clockwise direction. The bus bar lead 3B at the top of a row provided on the right side corresponds to the 54th terminal. The bus bar lead 3B corresponding to the first terminal and the bus bar lead 3B corresponding to the 27th terminal are integrally formed inside the mold resin 2. Further, the bus bar lead 3B corresponding to the 28th terminal and the bus bar lead 3B corresponding to the 54th terminal are integrally formed inside the mold resin 2.

Terminal names are assigned to their corresponding outer lead portions of the bus bar leads 3B and leads 3C. The terminal names shown in FIG. 1 correspond to terminal names of the upper chip 1B respectively, whereas the terminal names shown in FIG. 2 correspond to terminal names of the lower chip 1A respectively.

Vcc indicate source potential terminals each potentially fixed to a source or power supply potential (e.g., 3[V]), and Vss indicate reference potential terminals each potentially fixed to a reference potential (e.g., 0[V]). RAS indicates a row address strobe terminal, CAS indicates a column address strobe terminal, WE indicates a read/write enable terminal, DQM indicates an input/output mask terminal, CLK indicates a clock terminal, CKE indicates a clock enable terminal, CS indicates a chip select terminal, and $A_0$ through $A_{13}$ respectively indicate address input terminals, respectively. Any of these terminals is a terminal common to the two chips 1A and 1B.

$DQ_0$ through $DQ_7$ indicate data input/output terminals respectively. Of these terminals, $DQ_0$ through $DQ_3$ shown in FIG. 1 respectively correspond to data input/output terminals of the upper chip 1B. Leads 3C (corresponding to Numbers 53, 50, 47 and 44) marked with these terminal names respectively serve as NC (vacant or unassigned) terminals of the lower chip 1A (see FIG. 2). Further, $DQ_4$ through $DQ_7$ shown in FIG. 2 respectively correspond to data input/output terminals of the lower chip 1A. Leads 3C (corresponding to Numbers 11, 8, 5 and 2) to which these terminal names are assigned, respectively serve as NC (vacant or unassigned) terminals of the upper chip 1B (see FIG. 1). Incidentally, leads 3C marked with Numbers 4, 7, 10, 13, 15, 36, 40, 42, 45, 48 and 51 respectively correspond to NC terminals disconnected from both of the two chips 1A and 1B.

The bus bar leads 3B are principally placed one by one in the vicinity of the side faces of the two long sides of the chips 1A and 1B inside the mold resin 2. Both end (outer lead portions) of one bus bar lead 3B are drawn outside the mode resin 2 and constitute the source potential terminals (Vcc) to which the terminal numbers Nos. 1 and 27 are assigned. Both ends (outer lead portions) of the other bus bar lead 3B are drawn outside the mold resin 2 and constitute the reference potential terminals (Vss) marked with the terminal numbers Nos. 28 and 54. These bus bar leads 3B and 3B and the bonding pads BP of the upper chip 1B are electrically connected to one another through their corresponding wires 5 which comprise a low-resistance metal such as Au (see FIG. 1). Similarly, these bus bar leads 3B and 3B and the bonding pads BP of the lower chip 1A are electrically connected to one another through their corresponding wires 5 (see FIG. 2).

The inner lead portions of the plurality of leads 3C are placed inside the mold resin 2 so as to surround the chips 1A and 1B. Their leading ends are positioned slightly outwardly of the bus bar leads 3B. Of these leads 3C, the inner lead portions of the leads 3C which respectively constitute the source potential terminals (Vcc), reference potential terminals (Vss), row address strobe terminals (RAS), column address strobe terminals (CAS), read/write enable terminals (WE), input/output mask terminals (DQM), clock terminals (CLK), clock enable terminals (CLE), chip select terminals (CS), and address input terminals ($A_0$ through $A_{13}$) all of which are terminals common to the two chips 1A and 1B, are electrically connected to their corresponding bonding pads BP of the chip 1A and their corresponding bonding pads BP of the chip 1B through wires 5 (see FIGS. 1 and 2).

Further, the inner lead portions of the leads 3C, which respectively constitute the data input/output terminals ($DQ_0$ through $DQ_3$) of the upper chip 1B, are electrically connected to their corresponding pads BP of the chip 1B through wires 5 (see FIG. 1). The inner lead portions of the leads 3C, which respectively constitute the data input/output terminals ($DQ_4$ through $DQ_7$) of the lower chip 1A, are electrically connected to their corresponding bonding pads BP of the chip 1A through wires 5 (see FIG. 2).

A method of manufacturing the TSOP1 configured as described above will next be explained in process order with reference to FIGS. 5 through 14.

Figure 5:
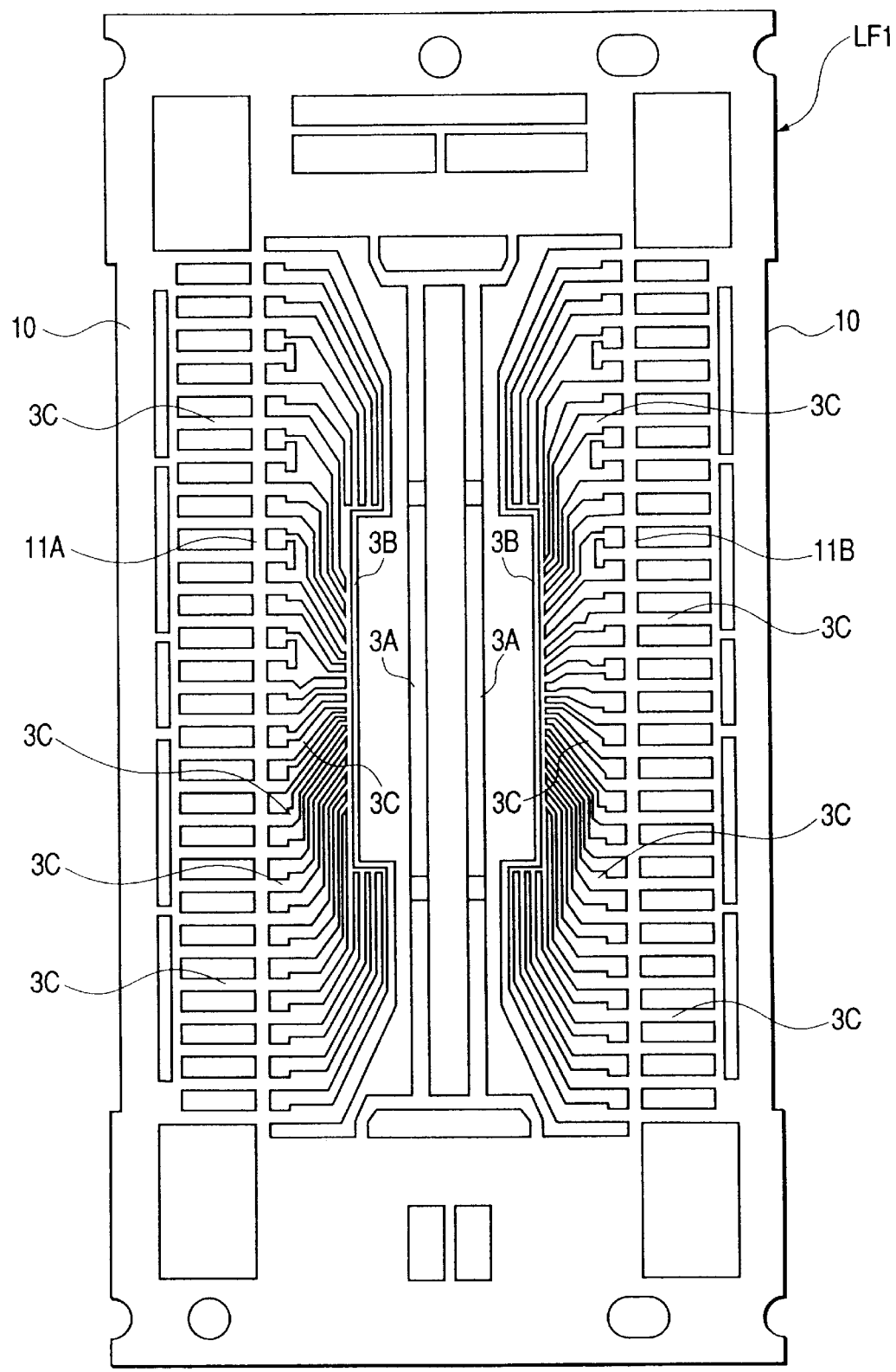
FIG. 5 is a plan view of a lead frame used for manufacturing the semiconductor device according to the embodiment 1 of the present invention.

FIG. 5 is a plan view of a lead frame LF1 used to manufacture the TSOP1. The lead frame LF1 takes a configuration wherein members such as suspension leads 3A, bus bar leads 3B and leads 3C are formed inside a rectangular frame body 10.

Lead groups on the left side of the drawing, of the bus bar leads 3B and leads 3C are connected to one another by one dam bar 11A extending in the longitudinal direction of the lead frame LF1. Similarly, lead groups on the right side of the drawing are coupled to one another by another dam bar 11B extending in the longitudinal direction of the lead frame LF1. These dam bars 11A and 11B are members for preventing a molten resin from leaking outwardly of a cavity of a mold die upon forming the mold resin 2 in a manufacturing process to be described later.

The lead frame LF1 is manufactured by processing a thin plate member comprised of an iron (Fe)-nickel (Ni) alloy such as a 42 alloy, or copper (Cu) or the like by etching, forming members such as the frame body 10, suspension leads 3A, bus bar leads 3B, leads 3C and dam bars 11A and 11B, etc. on the plate member, and thereafter bending parts of the suspension leads 3A in such a form as shown in FIG. 4 by press working. The thickness of the plate member, which constitutes the lead frame LF1, ranges from 0.1 mm to 0.12 mm, for example. The widths of the bus bar lead 2B and the lead 3C near the dam bars 11A and 11B are 0.4 mm, for example, and the pitches thereof are 1.27 mm, for example. Incidentally, an actual lead frame LF1 takes such a multiple structure that about 5 to 6 TSOPs can be formed simultaneously. However, an area corresponding to one TSOP1 is shown in FIG. 5.

Figure 6:
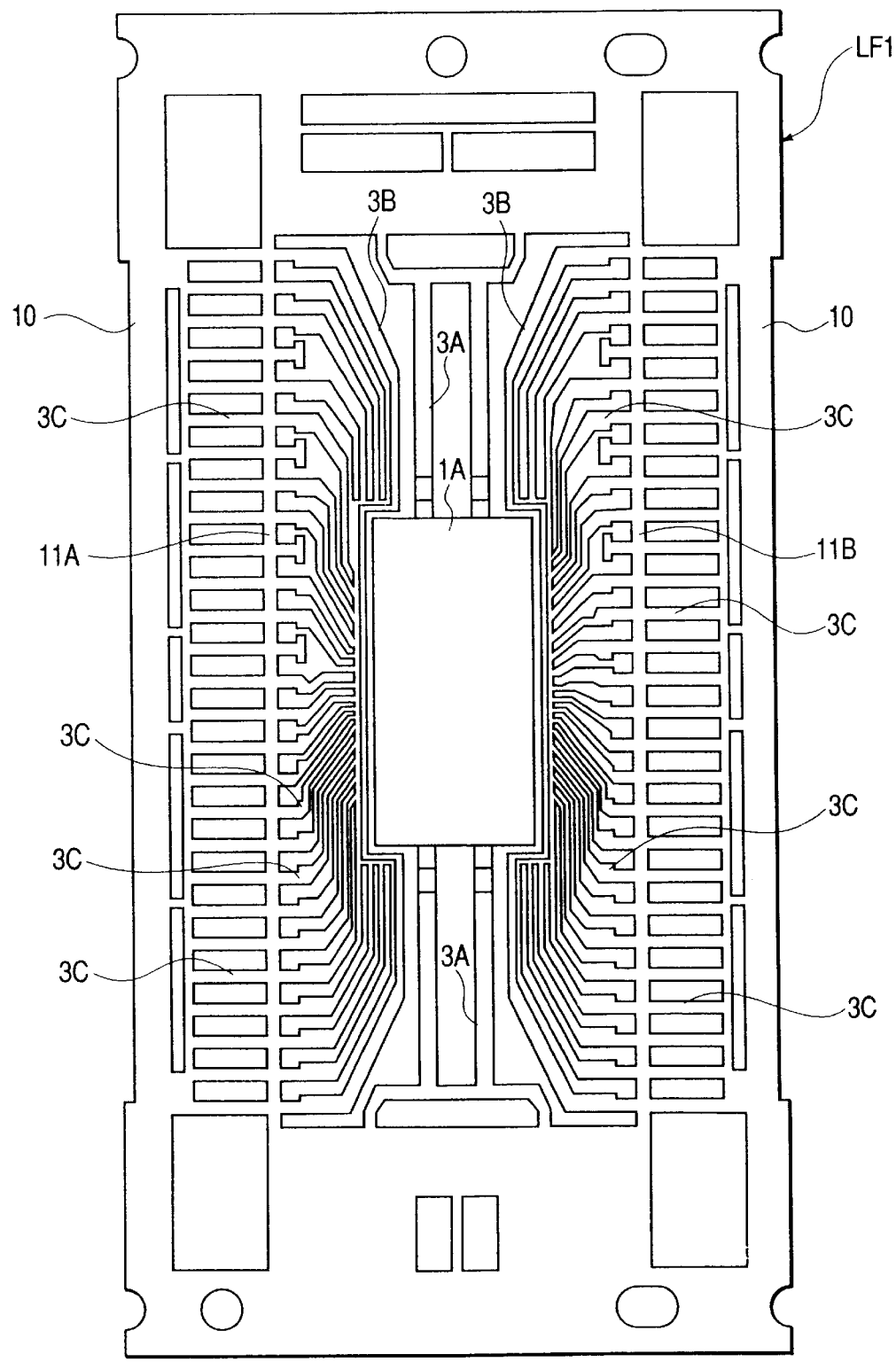
FIG. 6 is a plan view depicting a method of manufacturing the semiconductor device according to the embodiment 1 of the present invention.
Figure 7:
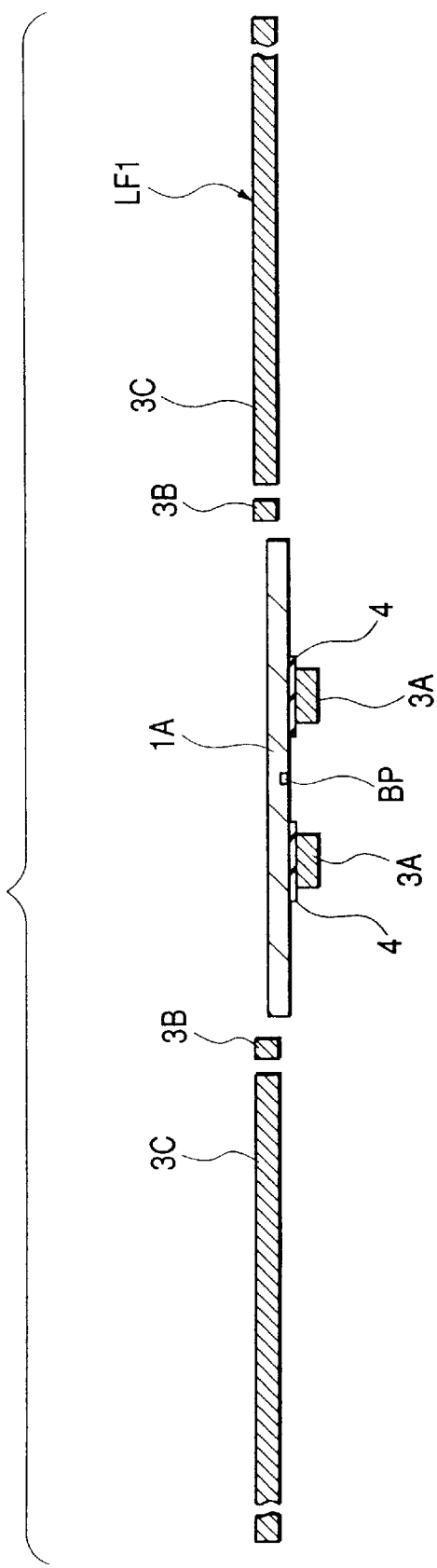
FIG. 7 is a cross-sectional view showing the method of manufacturing the semiconductor device according to the embodiment 1 of the present invention.

In order to manufacture the TSOP1 by using the lead frame LF1, a first chip 1A is first placed on the center of the lead frame LF1 as shown in FIGS. 6 and 7 (corresponding to a schematic cross-sectional view taken along line VII—VII of FIG. 6). In order to place the chip 1A on the lead frame LF1, insulating films 4 whose both surfaces are coated with an adhesive comprised of, for example, an acrylic/epoxy resin, are placed on a main surface (circuit forming surface) of the chip 1A. Next, the insulating films 4 are bonded to their corresponding suspension leads 3A of the lead frame LF1. Alternatively, the insulating films 4 are placed on the suspension leads 3A in advance and thereafter the main surface of the chip 1A may be stuck on the insulating films 4. In order to thin or reduce the thickness of the TSOP1 to 1 mm or less, the reverse sides or backs of the chip 1A (and chip 1B) are polished in advance to thin the thicknesses thereof to 200 µm or less, desirably 100 µm or less. As the insulating film 4, one is used which has a thickness of 50 µm or less, desirably 30 µm or less.

Figure 8:
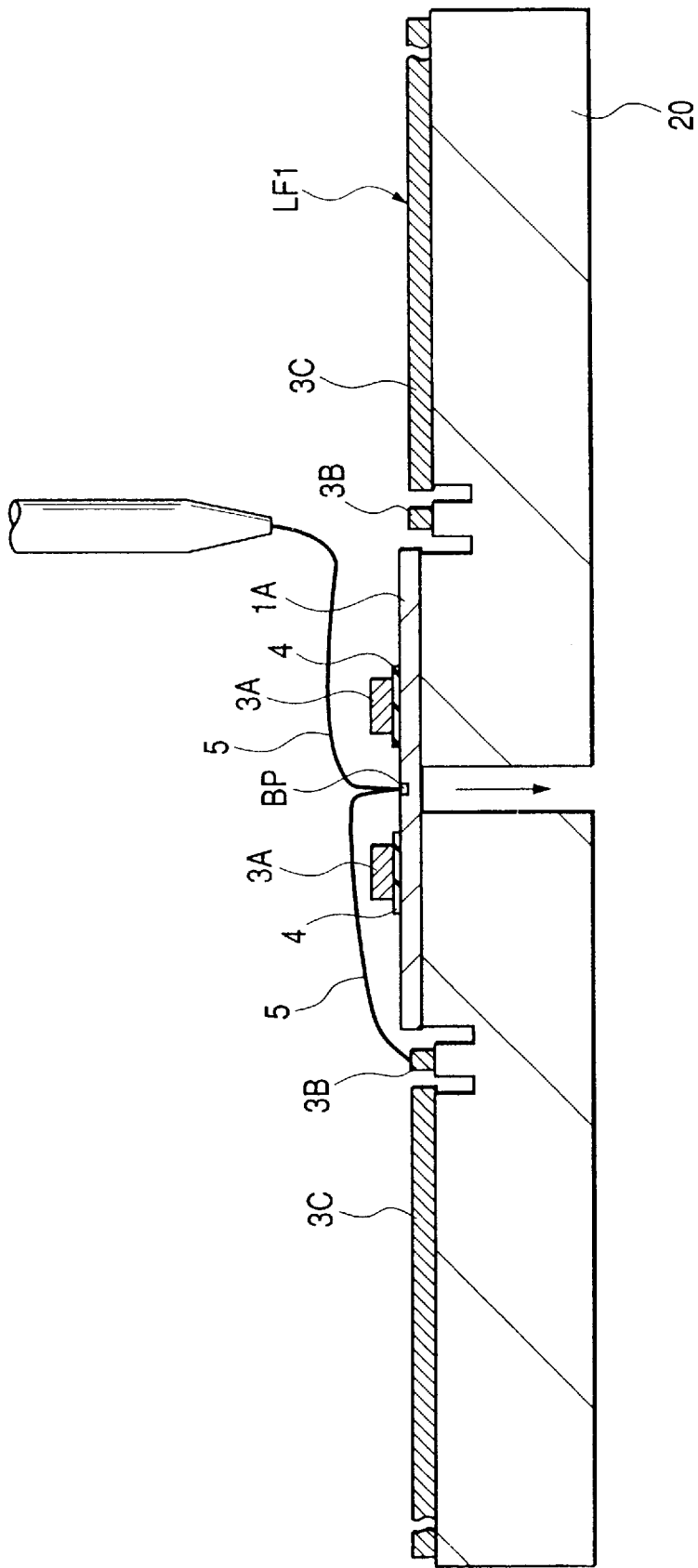
FIG. 8 is a cross-sectional view illustrating the method of manufacturing the semiconductor device according to the embodiment 1 of the present invention.

Next, as shown in FIG. 8, the lead frame LF1 equipped with the chip 1A is placed on a heat stage 20 of a wire bonding device (not shown). The back of the chip 1A is fixed to the heat stage 20 by vacuum absorption or the like. Thereafter, bus bar leads 3B and leads 3C of the lead frame LF1, and their corresponding bonding pads BP of the chip 1A are respectively electrically connected to one another by wires 5. For example, metal (Au) wires are used as the wires 5. As a connecting method using the wires 5, a wire bonding method which utilizes, for example, thermo compression bonding and supersonic vibrations in combination, is used.

Figure 9:
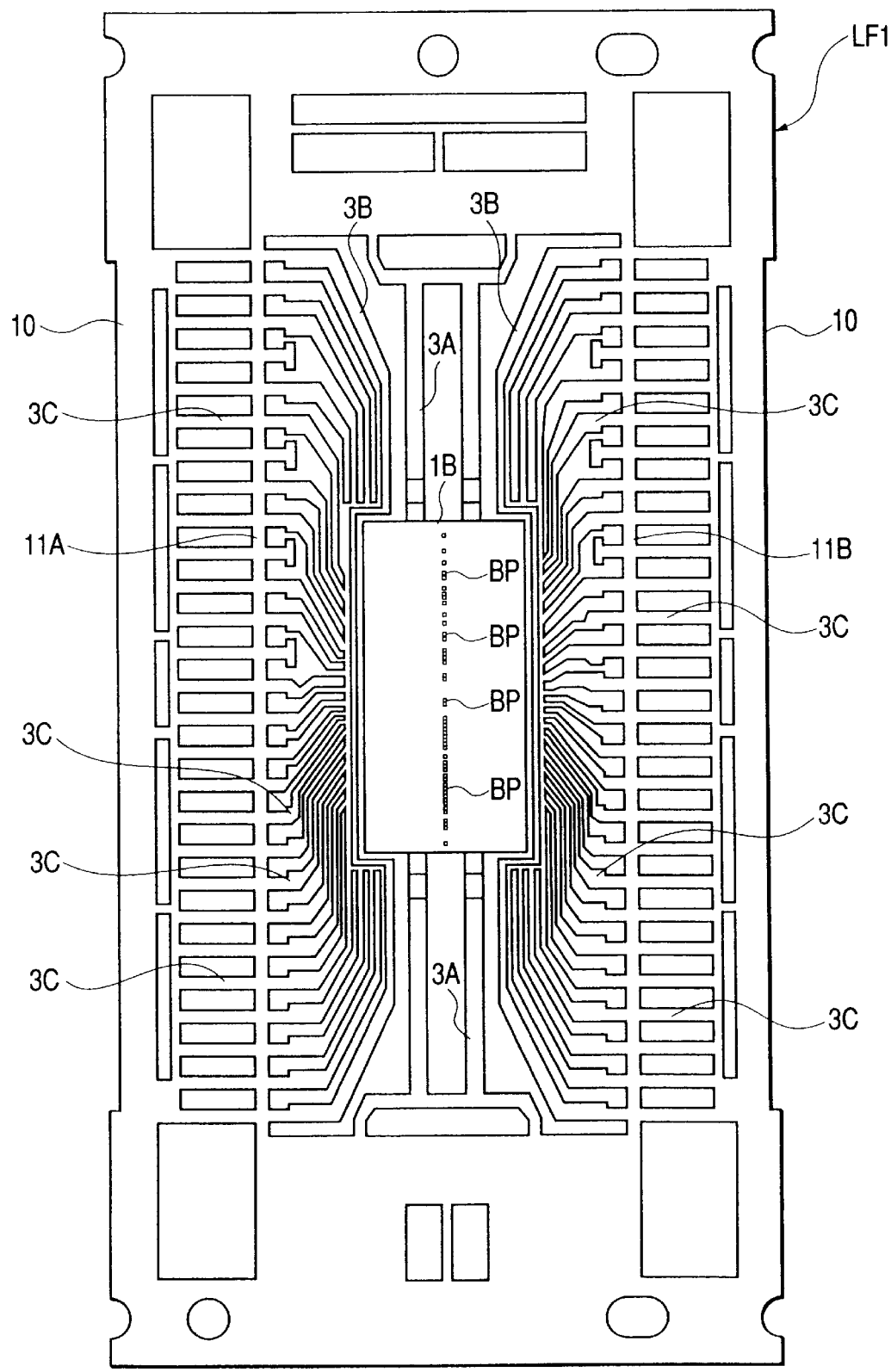
FIG. 9 is a plan view depicting the method of manufacturing the semiconductor device according to the embodiment 1 of the present invention.
Figure 10:
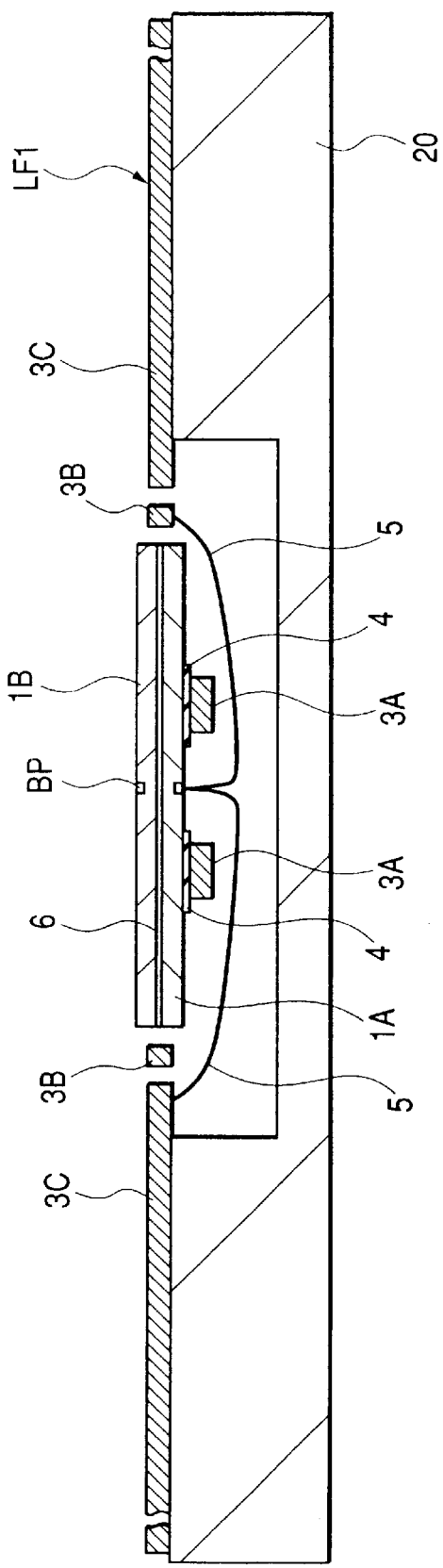
FIG. 10 is a cross-sectional view illustrating the method of manufacturing the semiconductor device according to the embodiment 1 of the present invention.
Figure 11:
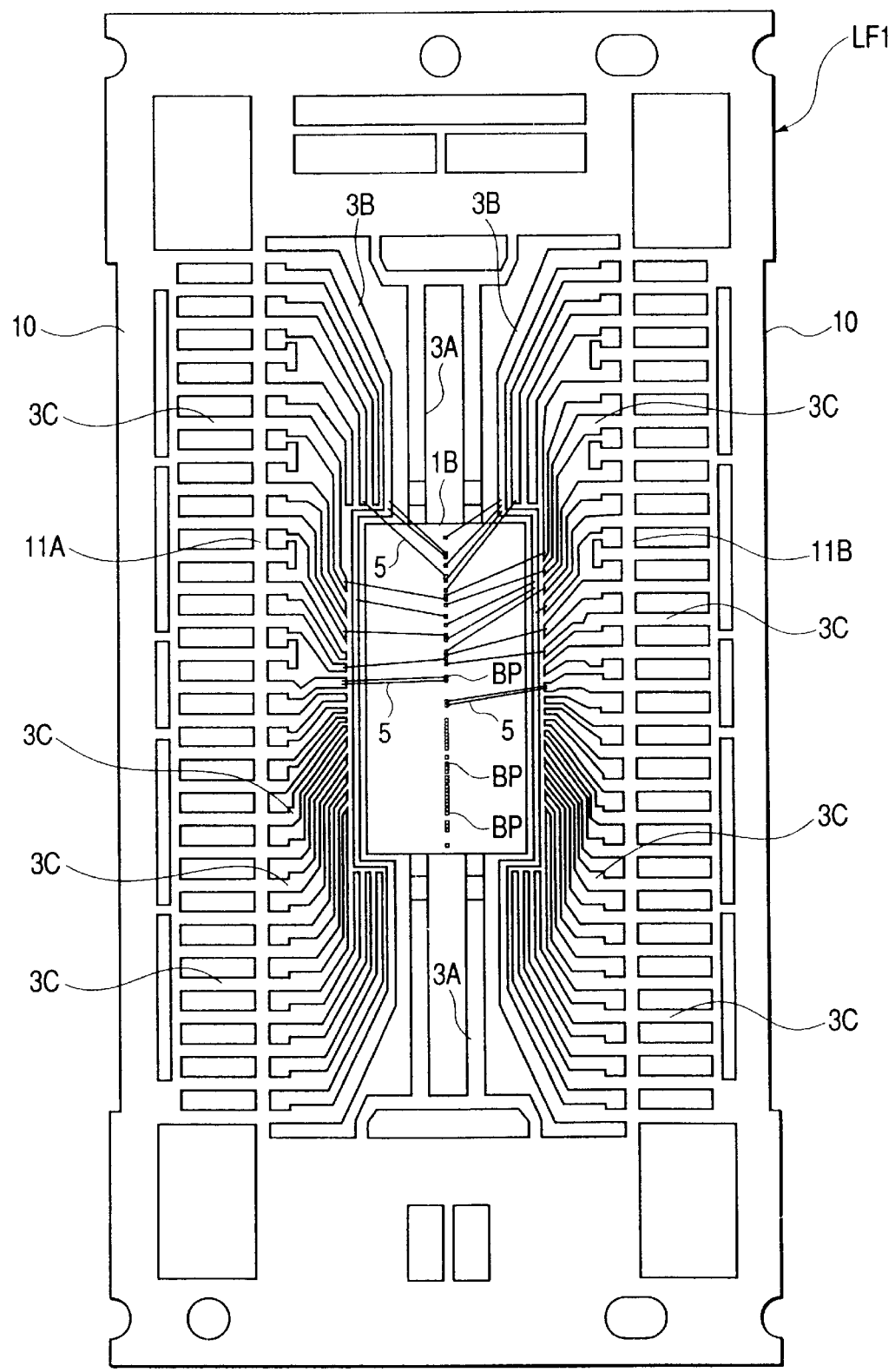
FIG. 11 is a plan view depicting the method of manufacturing the semiconductor device according to the embodiment 1 of the present invention.
Figure 12:
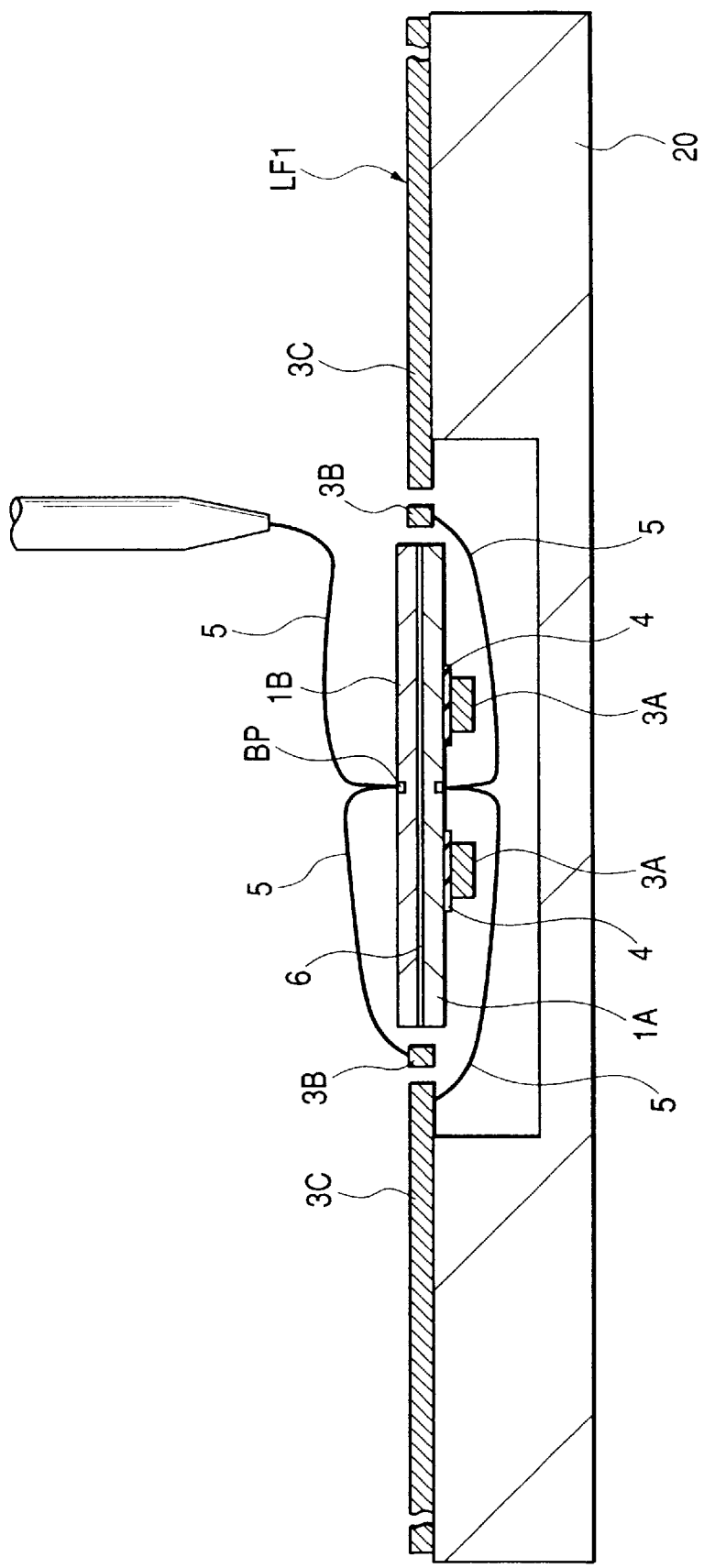
FIG. 12 is a cross-sectional view showing the method of manufacturing the semiconductor device according to the embodiment 1 of the present invention.

Next, as shown in FIGS. 9 and 10, the reverse side or back of a second chip 1B is superimposed on the back of the chip 1A. Their backs are bonded to each other with an adhesive 6 such as Ag paste or the like. Thereafter, as shown in FIGS. 11 and 12, the bus bar leads 3B and leads 3C of the lead frame LF1, and their corresponding bonding pads BP of the chip LB are respectively electrically connected to one another by wires 5.

Figure 13:
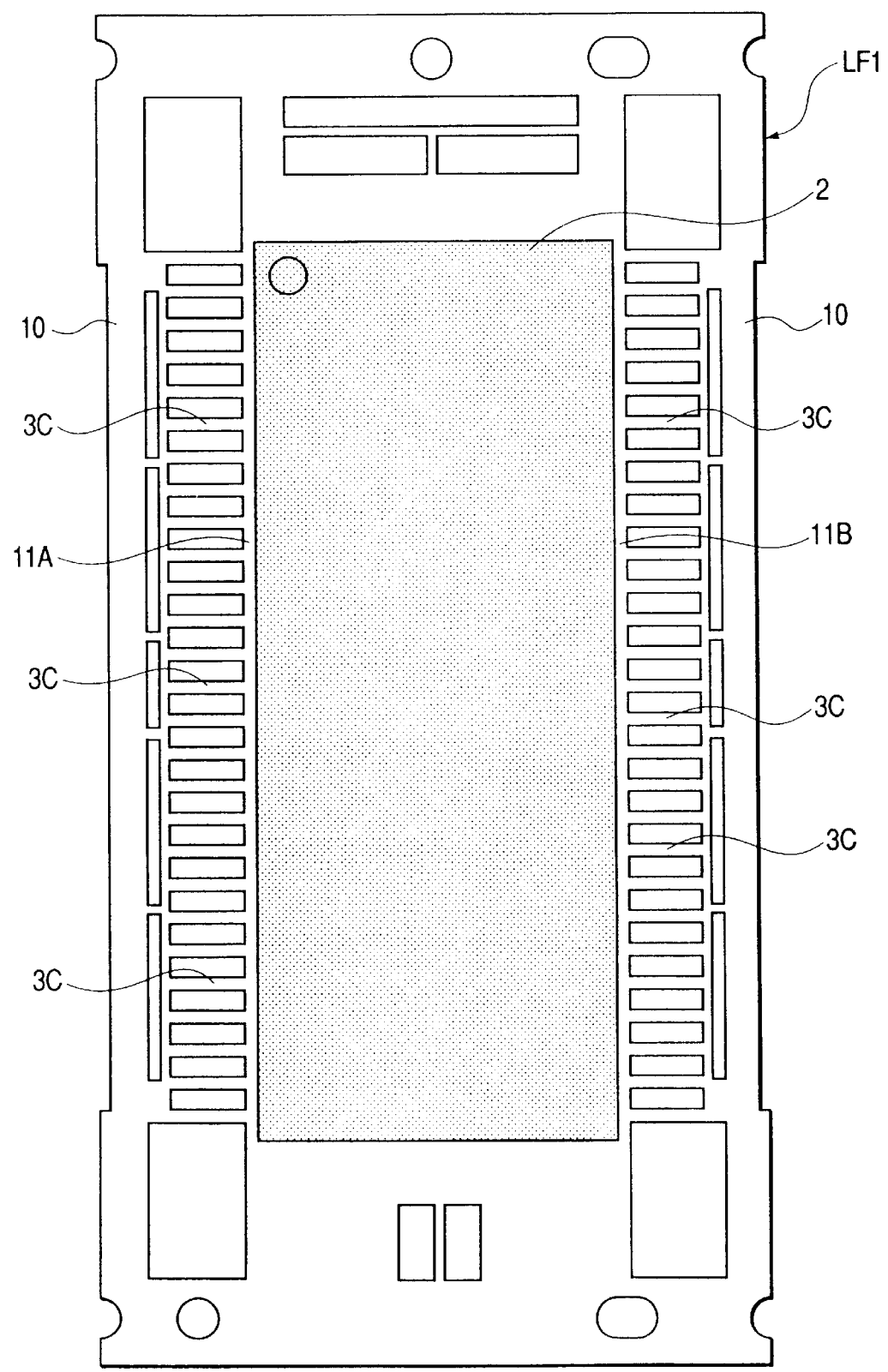
FIG. 13 is a plan view depicting the method of manufacturing the semiconductor device according to the embodiment 1 of the present invention.
Figure 14:
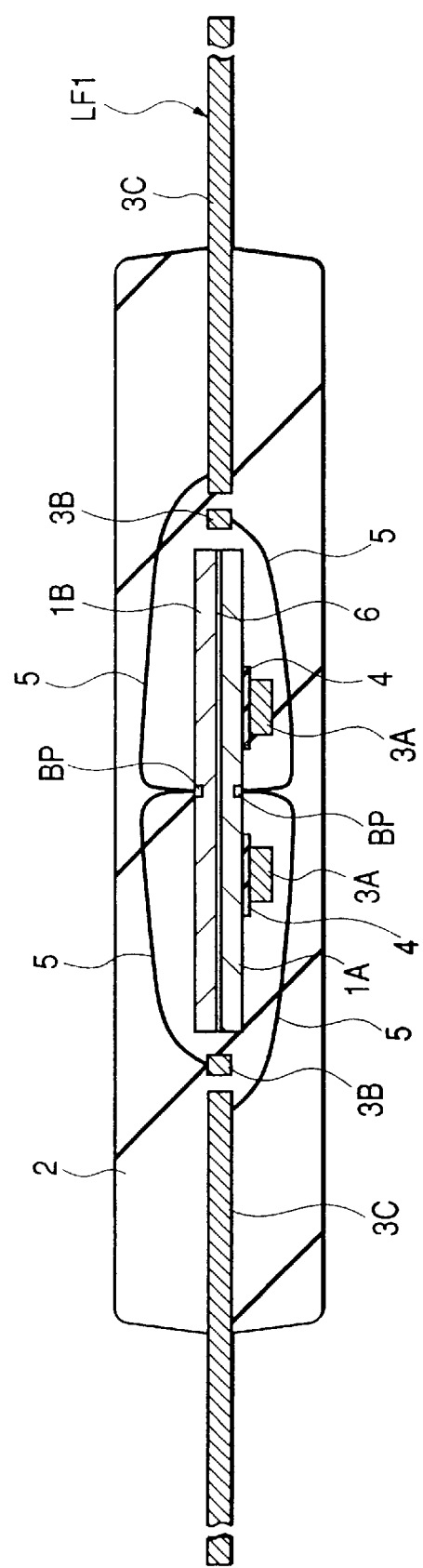
FIG. 14 is a cross-sectional view showing the method of manufacturing the semiconductor device according to the embodiment 1 of the present invention.

Next, the lead frame LF1 is mounted to a mold die (not shown). As shown in FIGS. 13 and 14, the two chips 1A and 1B and the wires 5 are sealed with a mold resin 2 together with part of the lead frame LF1. An epoxy resin containing silica, for example, is used as the mold resin 2.

Thereafter, the surface of the lead frame LF1, which is exposed outside the mold resin 2, is subjected to solder plating. Afterwards, the cutting and removal of unnecessary points or places (dam bars 11A and 11B and frame body 10) of the lead frame LF1, the removal (burring) of the resin left in clearances or gaps defined between the sides of the mold resin 2 and the dam bars 11A and 11B, etc. are performed. Subsequently, outer lead portions of the bus bar leads 3B and leads 3C, which have been exposed outside the mold resin 2, are shaped in gull-wing form, whereby the TSOP1 shown in FIGS. 1 through 4 is completed.

According to the present embodiment as described above, the two chips 1A and 1B with DRAM formed thereon are stacked on each other and sealed with the mold resin 2. Thus, a DRAM package having capacity corresponding to substantially twice that of a TSOP wherein one chip is sealed with a mold resin, can be implemented. Namely, the mounting of the TSOP1 according to the present embodiment on the module substrate allows the implementation of a large-capacity DIMM (Dual In-line Memory Module) suitable for use in main memories of a personal computer, WS (Work Station), etc. Incidentally, the TSOP1 according to the present embodiment can be implemented on the module substrate by the same method as that for the normal TSOP.

According to the present embodiment, since the number of parts is restrained from increasing by supporting the two chips 1A and 1B with the suspension leads 3A of one lead frame LF1, the manufacturing cost of the TSOP wherein the two chips 1A and 1B are sealed with the mold resin 2, can be reduced. Further, since the thickness of the mold resin 2 as viewed in the direction in which the chips 1A and 1B are stacked on each other, can be thinned as compared with the LOC structure wherein the leads are placed on the respective main surfaces of the two chips 1A and 1B, an ultra-thin TSOP1 can be implemented.

Embodiment 2

Figure 15:
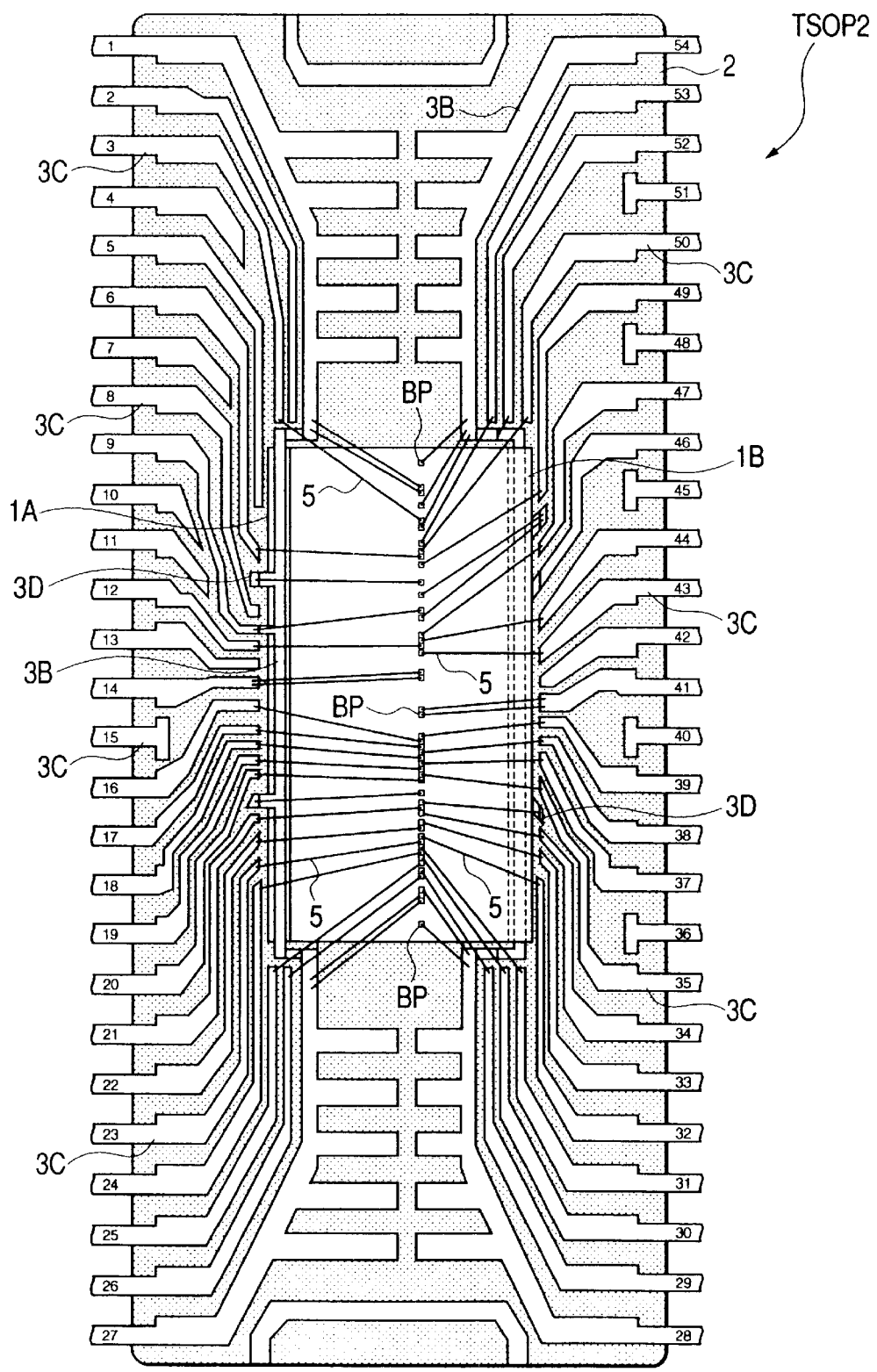
FIG. 15 is a plan view illustrating an upper surface of a semiconductor device according to an embodiment 2 of the present invention.
Figure 16:
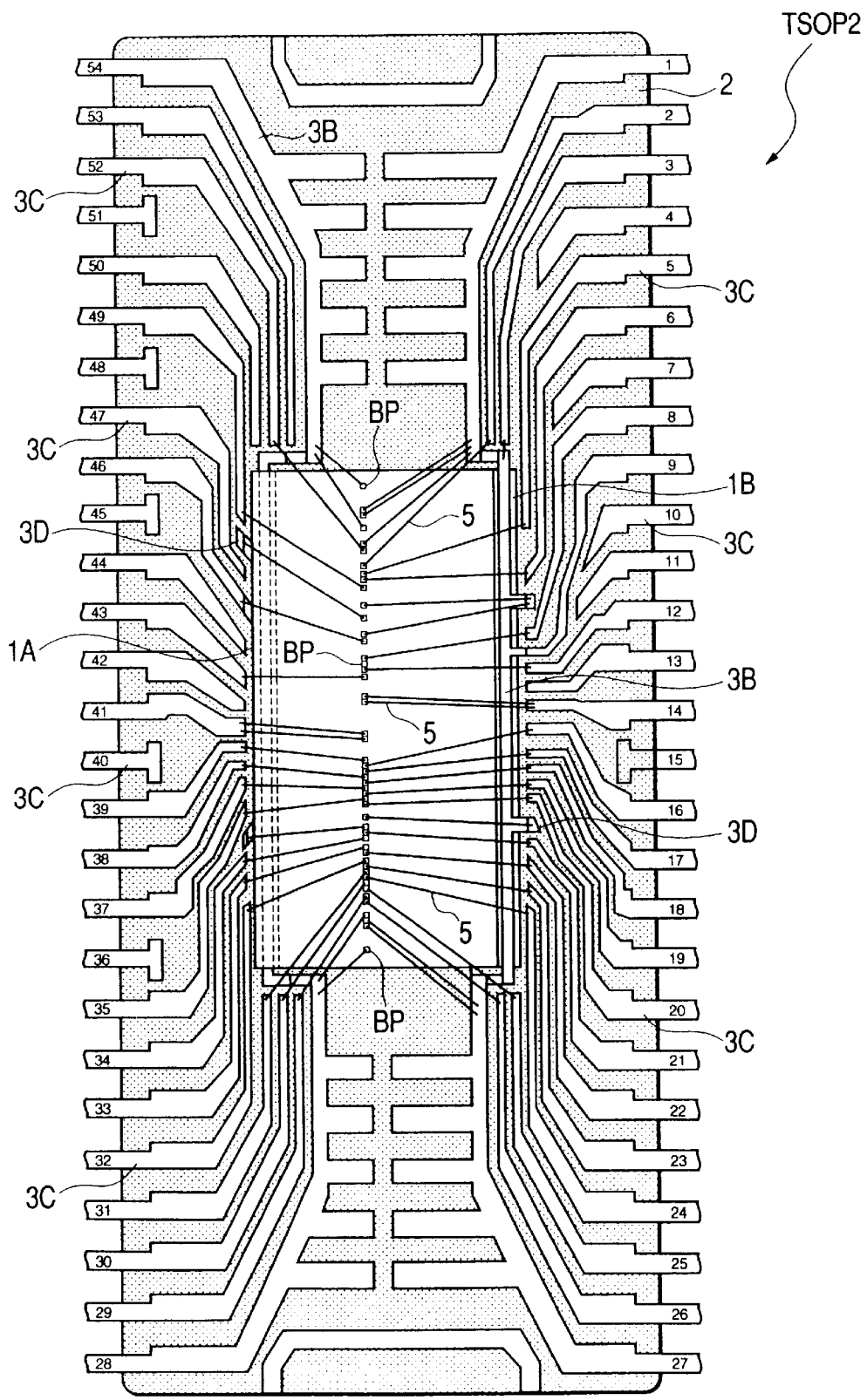
FIG. 16 is a plan view depicting a lower surface of the semiconductor device according to the embodiment 2 of the present invention.
Figure 17:
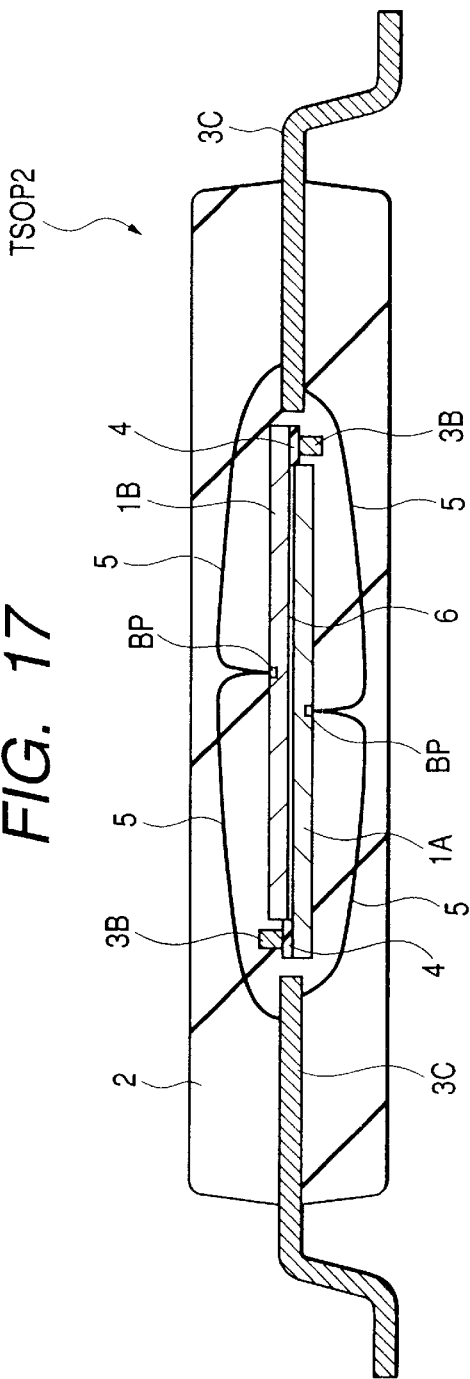
FIG. 17 is a cross-sectional view of the semiconductor device according to the embodiment 2 of the present invention.
Figure 18:
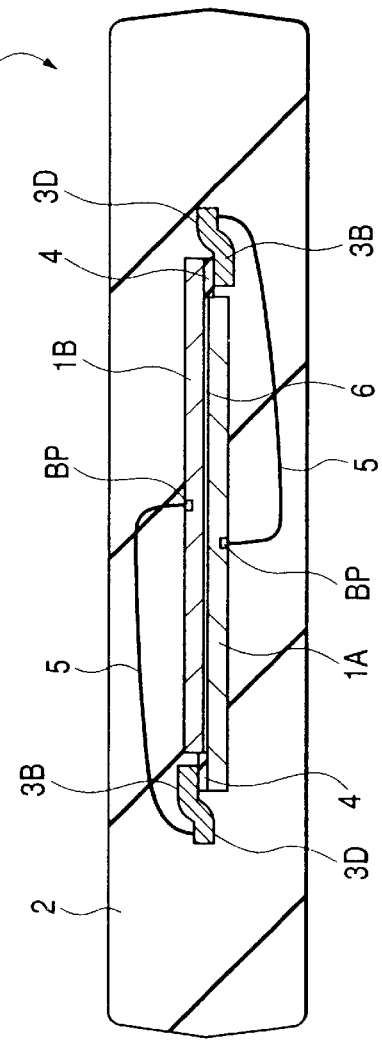
FIG. 18 is a cross-sectional view of the semiconductor device according to the embodiment 2 of the present invention.

FIG. 15 is a plan view showing an upper surface of a semiconductor device according to the present embodiment in a state in which part of a mold resin has been removed, FIG. 16 is a plan view illustrating a lower surface (mounting surface) of the semiconductor device in a state in which part of the mold resin has been removed, FIGS. 17 and 18 are respectively cross-sectional views taken along the transverse direction of the semiconductor device, and FIGS. 19(a) and 19(b) are respectively cross-sectional views taken along the longitudinal direction of the semiconductor device, respectively.

While the TSOP1 according to the embodiment 1 takes the structure wherein the two chips 1A and 1B laminated by superimposing their backs on each other are supported by the two suspension leads 3A and 3A, a TSOP2 according to the present embodiment takes a structure wherein two chips 1A and 1B laminated by superimposing their reverse sides on each other are supported by two bus bar leads 3B and 3B. Namely, according to the present TSOP2, the bus bar leads 3B double as the suspension leads 3A of the TSOP1.

In the two chips 1A and 1B, their mutual positions are slightly shifted in their transverse directions. Further, only areas in which both are superimposed on each other, are fixed to each other with an adhesive 6. Namely, a part of the upper surface (back) of the lower chip 1A does not overlap with the upper chip 1B in the vicinity of one long side of the chip 1A. Further, one bus bar lead 3B is fixedly secured to this area with one insulating film 4 interposed therebetween. Similarly, apart of the lower surface (circuit forming surface) of the upper chip 1B does not overlap with the lower chip 1A in the vicinity of one long side thereof. Further, another bus bar lead 3B is fixedly secured to this region with another insulating film 4 interposed therebetween. As the insulating film 4, one whose both surfaces are coated with an adhesive (not shown), is used.

In the vicinity of the long sides of the chips 1A and 1B as shown in FIG. 18, the bus bar lead 3B fixedly secured to the upper surface of the chip 1A and the bus bar lead 3B fixedly secured to the lower surface of the chip 1B are respectively provided with a plurality of short branch leads 3D extending in the direction orthogonal to the direction in which the bus bar leads extend. One ends of wires 5 for respectively electrically connecting the chips 1A and 1B and the bus bar leads 3B are bonded to tips or leading ends of these branch leads 3D. As shown in FIGS. 19(a) and 19(b), one of the two bus bar leads 3B is bent upward in the vicinity of the short sides of the chips 1A and 1B, whereas the other thereof is bent downward in the vicinity of the short sides of the chips 1A and 1B.

As shown in FIGS. 15 and 16, respective outer lead portions of the bus bar leads 3B and leads 3C are assigned terminal numbers No. 1 to No. 54. Since their terminal names are identical to those employed in the embodiment 1, the display thereof will therefore be omitted.

Figure 20:
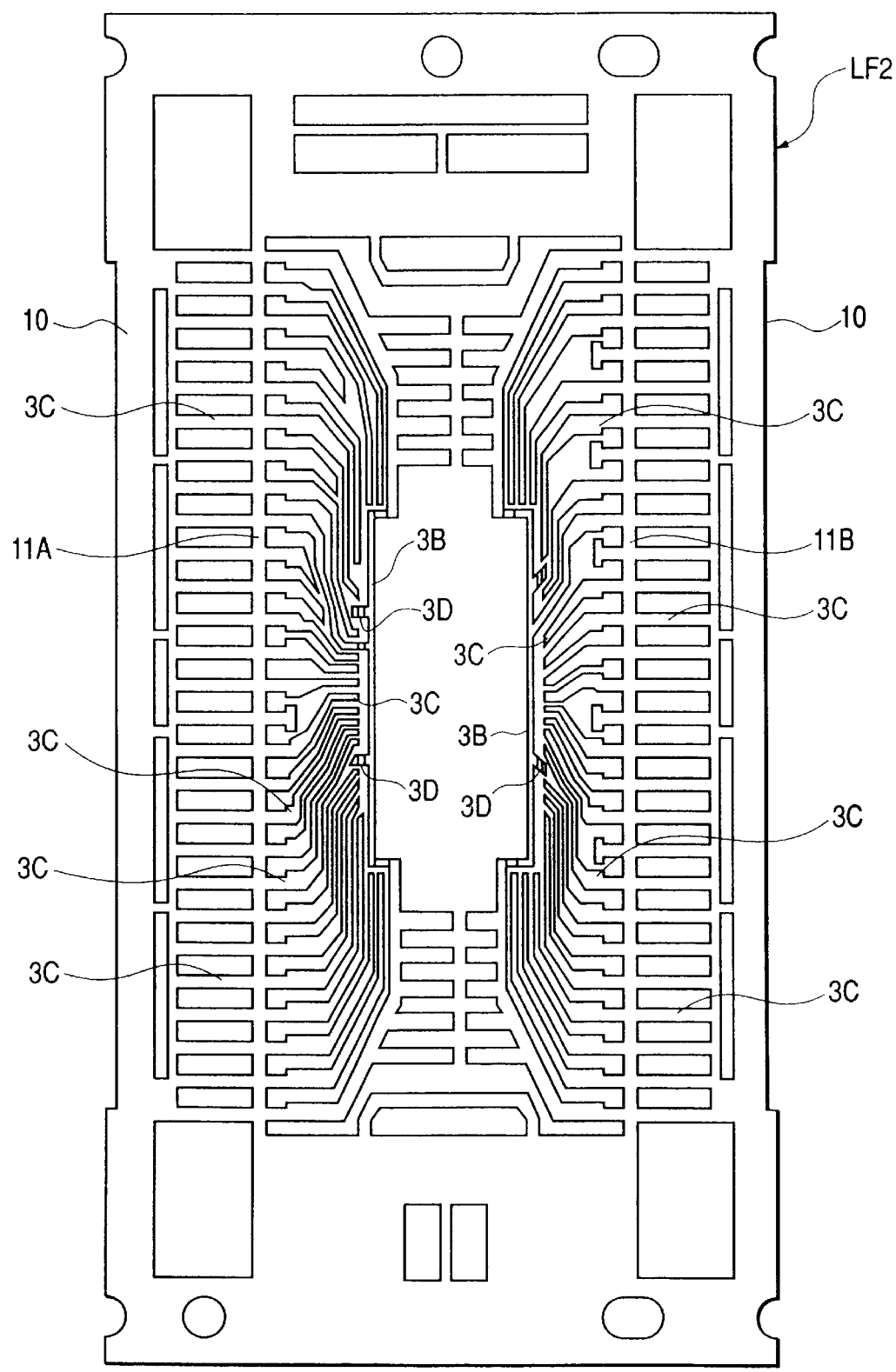
FIG. 20 is a plan view of a lead frame used for manufacturing the semiconductor device according to the embodiment 2 of the present invention.

FIG. 20 is a plan view of a lead frame LF2 used to manufacture the TSOP2. The present lead frame LF2 takes a structure wherein members such as the bus bar leads 3B, leads 3C and dam bars 11A and 11B, etc. are formed inside a rectangular frame body 10.

The manufacture of the TSOP2, which uses the lead frame LF2, may be performed in accordance with the method described in the embodiment 1. Namely, although unillustrated in the drawing, a first chip 1A is first fixedly secured to one of the two bus bar leads 3B formed in the lead frame LF2 with insulating films 4 interposed therebetween. Thereafter, the bus bar lead 3B and leads 3C and their corresponding bonding pads BP of the chip 1A are respectively electrically connected to one another by wires 5. Next, a second chip 1B is fixedly secured to another bus bar lead 3B with insulating films 4 interposed therebetween. Further, the backs of the chips 1A and 1B are fixedly secured to each other with an adhesive 6. Thereafter, the bus bar lead 3B and leads 3C and their corresponding bonding pads BP of the chip 1B are electrically connected to one another by wires 5.

Next, the lead frame LF2 is mounted to a mold die. The two chips 1A and 1B and the wires 5 are sealed with a mold resin 2 together with part of the lead frame LF2. Subsequently, the surface of the lead frame LF2, which is exposed outside the mold resin 2, is subjected to solder plating. Further, the cutting and removal of unnecessary points or places of the lead frame LF2, and the burring of the mold resin 2, etc. are performed. Afterwards, outer lead portions of the bus bar leads 3B and leads 3C, which have been exposed outside the mold resin 2, are shaped in gull-wing form, whereby the TSOP2 shown in FIGS. 15 through 19 is completed.

Embodiment 3

Figure 21:
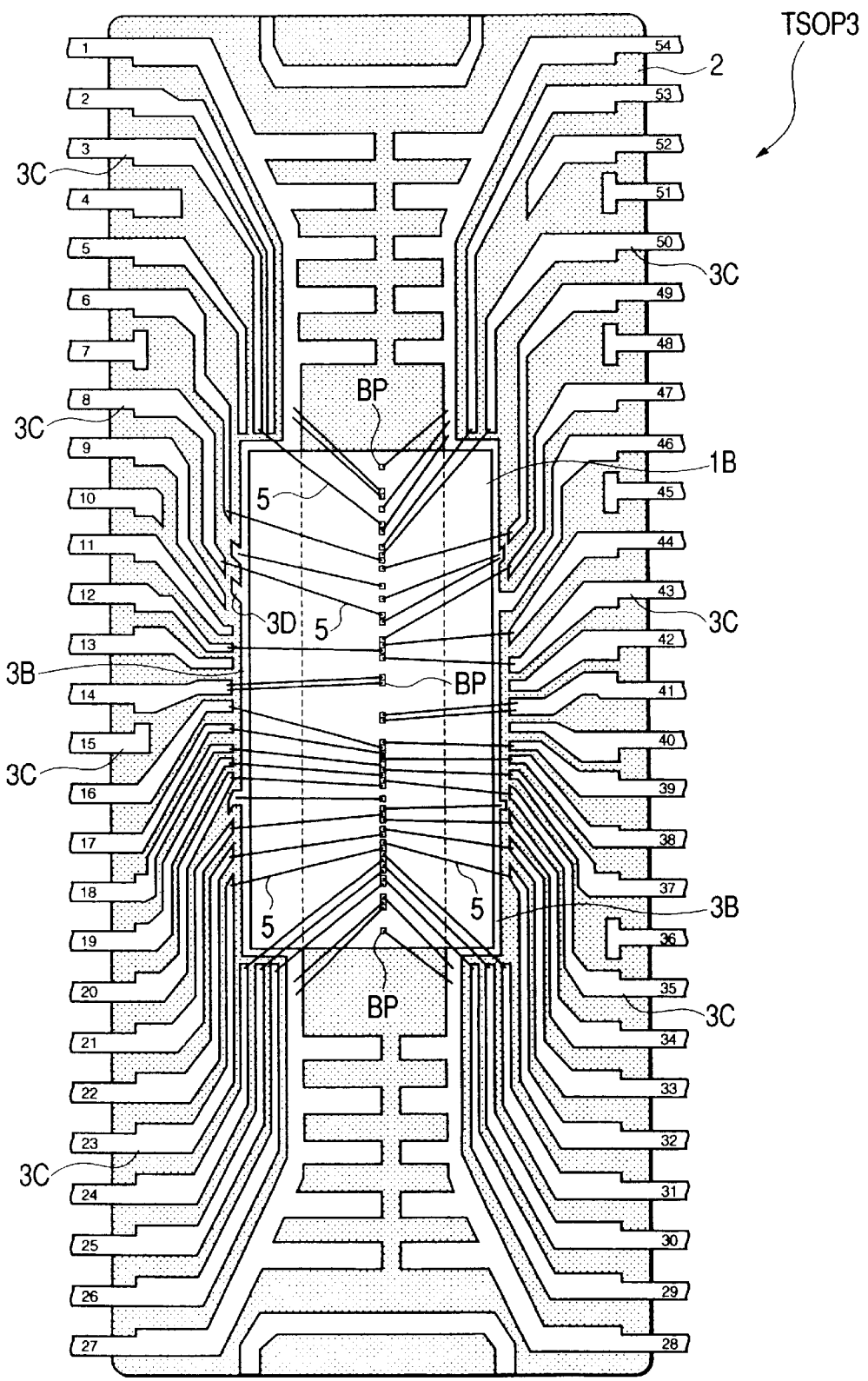
FIG. 21 is a plan view showing an upper surface of a semiconductor device according to an embodiment 3 of the present invention.
Figure 22:
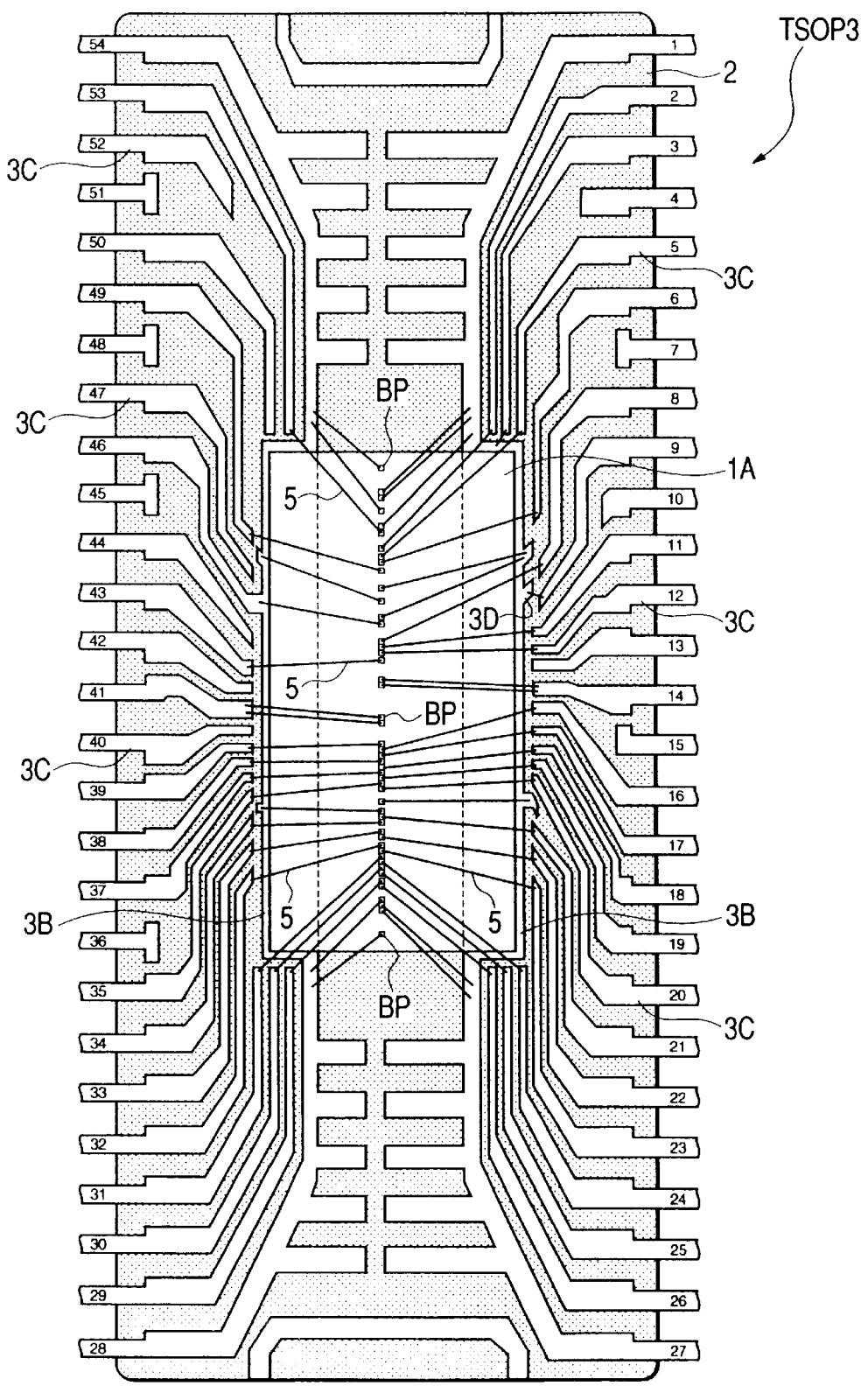
FIG. 22 is a plan view illustrating a lower surface of the semiconductor device according to the embodiment 3 of the present invention.
Figure 23:
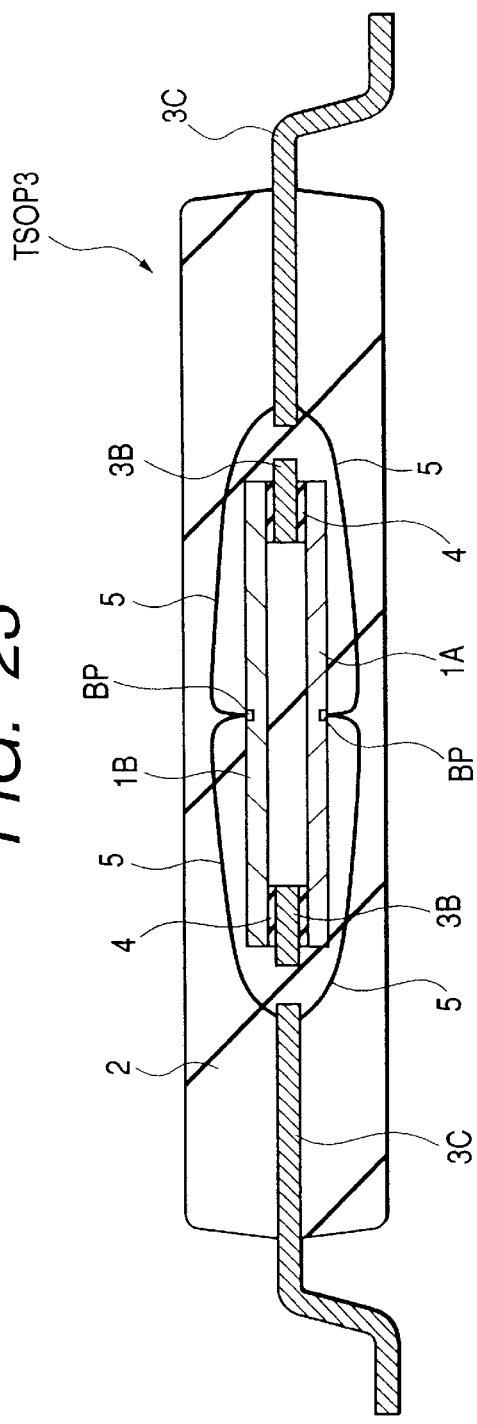
FIG. 23 is a cross-sectional view of the semiconductor device according to the embodiment 3 of the present invention.
Figure 24:
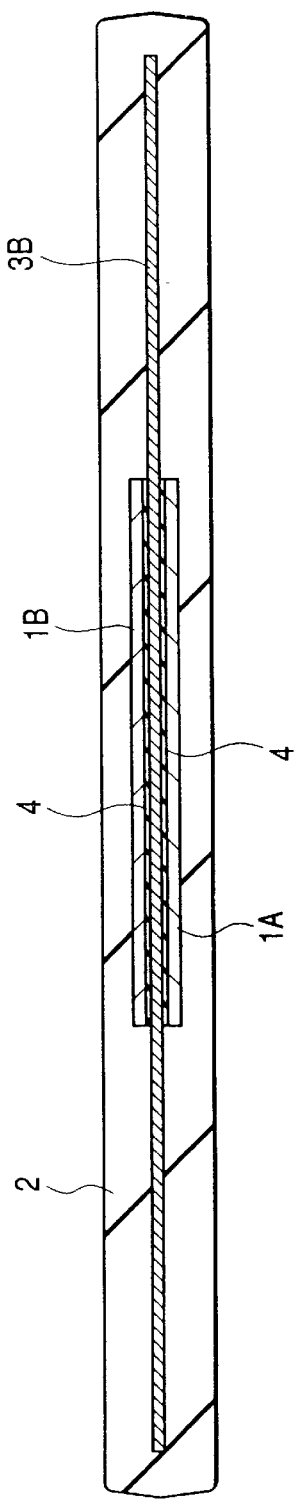
FIG. 24 is a cross-sectional view of the semiconductor device according to the embodiment 3 of the present invention.

FIG. 21 is a plan view showing an upper surface of a semiconductor device according to the present embodiment in a state in which part of a mold resin has been removed, FIG. 22 is a plan view illustrating a lower surface (mounting surface) of the semiconductor device in a state in which part of the mold resin has been removed, FIG. 23 is a cross-sectional view taken along the transverse direction of the semiconductor device, and FIG. 24 is a cross-sectional view taken along the longitudinal direction of the semiconductor device, respectively.

In a TSOP3 according to the present embodiment, two bus bar leads 3B and 3B extending in parallel along the longitudinal directions of two chips 1A and 1B whose backs are opposite to each other, are interposed between the two chips 1A and 1B to thereby support the chips 1A and 1B. These bus bar leads 3B are fixedly secured to their corresponding backs of the chips 1A and 1B with insulating films 4 whose both surfaces are coated with an adhesive (not shown), being interposed therebetween. Namely, the present TSOP3 is configured so that the bus bar leads 3B double as the suspension leads 3A of the TSOP1.

Parts of the two bus bar leads 3B and 3B interposed between the chips 1A and 1B extend outward from the sides of the chips 1A and 1B. One ends of wires 5 for respectively electrically connecting the chips 1A and 1B and the bus bar leads 3B are bonded to their corresponding tips or leading ends of branch leads 3D formed thereat.

As shown in FIGS. 21 and 22, respective outer lead portions of the bus bar leads 3B and leads 3C are assigned terminal numbers No. 1 to No. 54 . Since their terminal names are identical to those employed in the embodiment 1, the display thereof will therefore be omitted.

Figure 25:
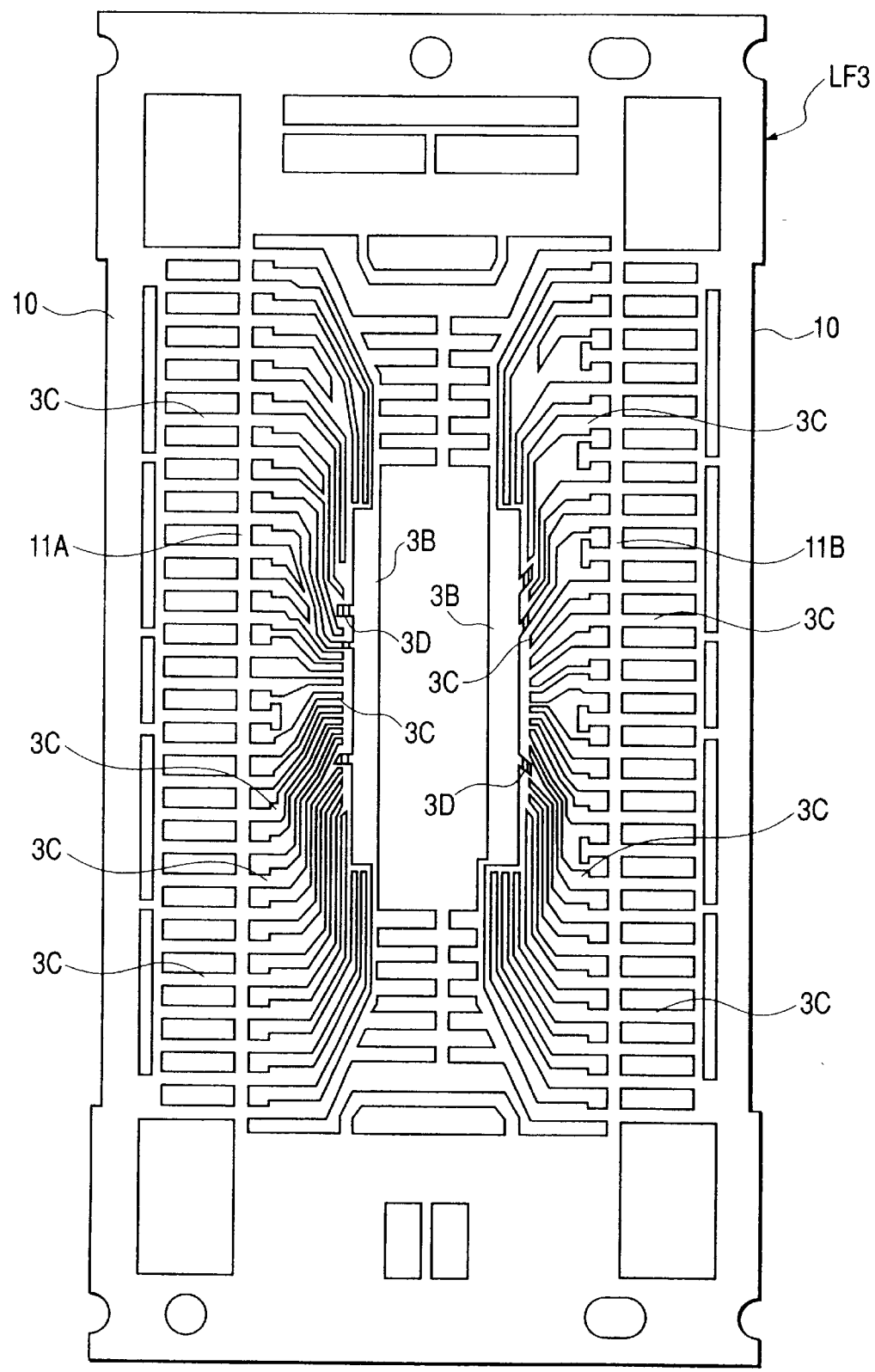
FIG. 25 is a plan view of a lead frame used for manufacturing the semiconductor device according to the embodiment 3 of the present invention.

FIG. 25 is a plan view of a lead frame LF3 used to manufacture the TSOP3. The present lead frame LF3 takes a structure wherein members such as the bus bar leads 3B, leads 3C and dam bars 11A and 11B, etc. are formed inside a rectangular frame body 10.

The manufacture of the TSOP3, which uses the lead frame LF3, may be performed in accordance with the method described in the embodiment 1. Namely, although unillustrated in the drawing, a first chip 1A is first fixedly secured to one sides of the two bus bar leads 3B formed in the lead frame LF3 with insulating films 4 interposed therebetween. Thereafter, the bus bar lead 3B and leads 3C and their corresponding bonding pads BP of the chip 1A are respectively electrically connected to one another by wires 5. Next, a second chip 1B is fixedly secured to the other sides of the bus bar leads 3B with insulating films 4 interposed therebetween. Thereafter, the bus bar lead 3B and leads 3C and their corresponding bonding pads BP of the chip 1B are electrically connected to one another by wires 5.

Next, the lead frame LF3 is mounted to a mold die. The two chips 1A and 1B and the wires 5 are sealed with a mold resin 2 together with part of the lead frame LF3. Subsequently, the surface of the lead frame LF3, which is exposed outside the mold resin 2, is subjected to solder plating. Further, the cutting and removal of unnecessary points or places of the lead frame LF3, and the burring of the mold resin 2, etc. are performed. Afterwards, outer lead portions of the bus bar leads 3B and leads 3C, which have been exposed outside the mold resin 2, are shaped in gull-wing form, whereby the TSOP3 shown in FIGS. 21 through 24 is completed.

While the invention made by the present inventors has been described above specifically by the embodiments, the present invention is not necessarily limited to the embodiments. It is needless to say that various changes can be made within the scope not departing from the substance thereof.

Figure 26:
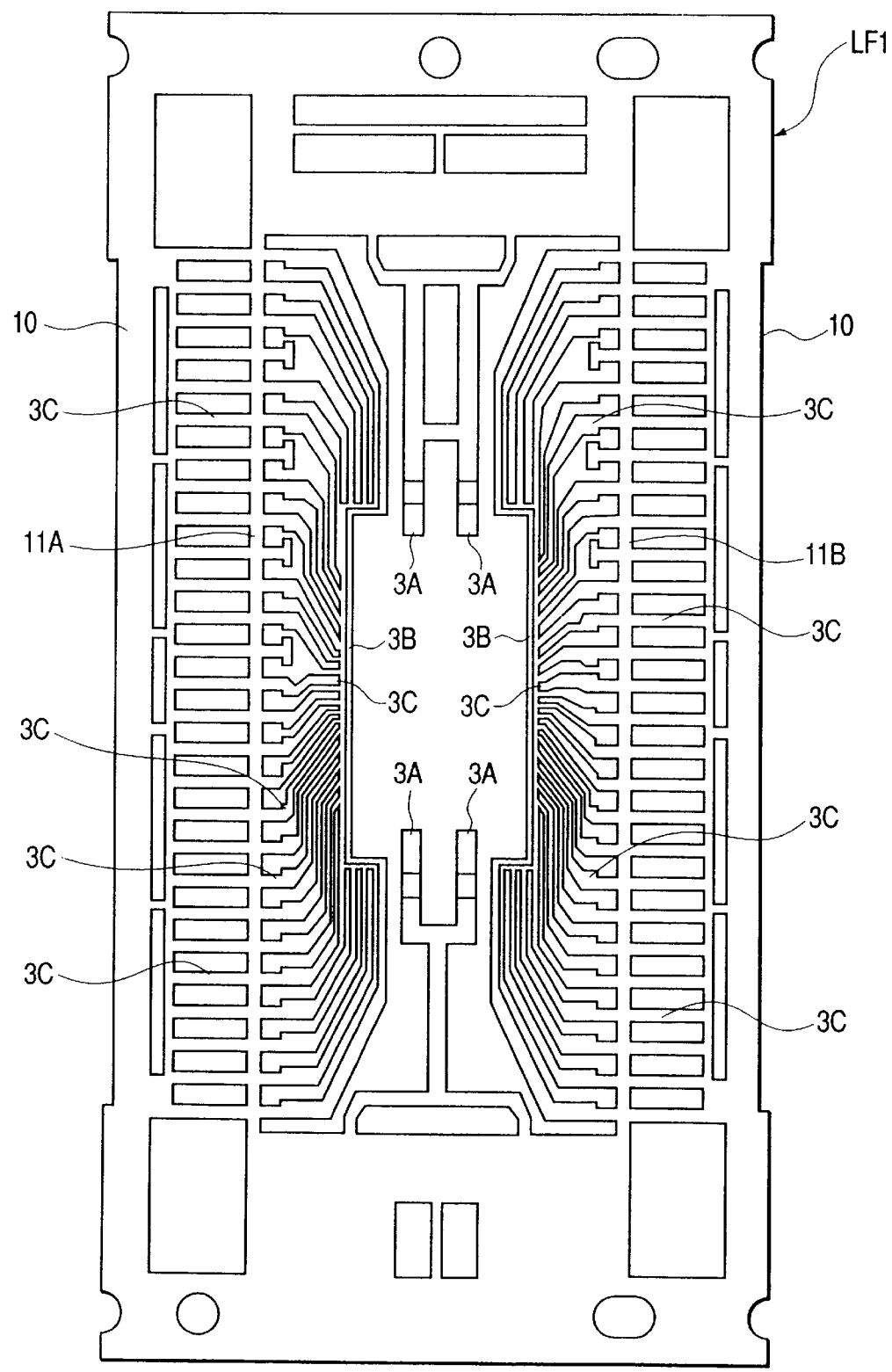
FIG. 26 is a plan view showing an upper surface of a semiconductor device according to a still further embodiment of the present invention.
Figure 27:
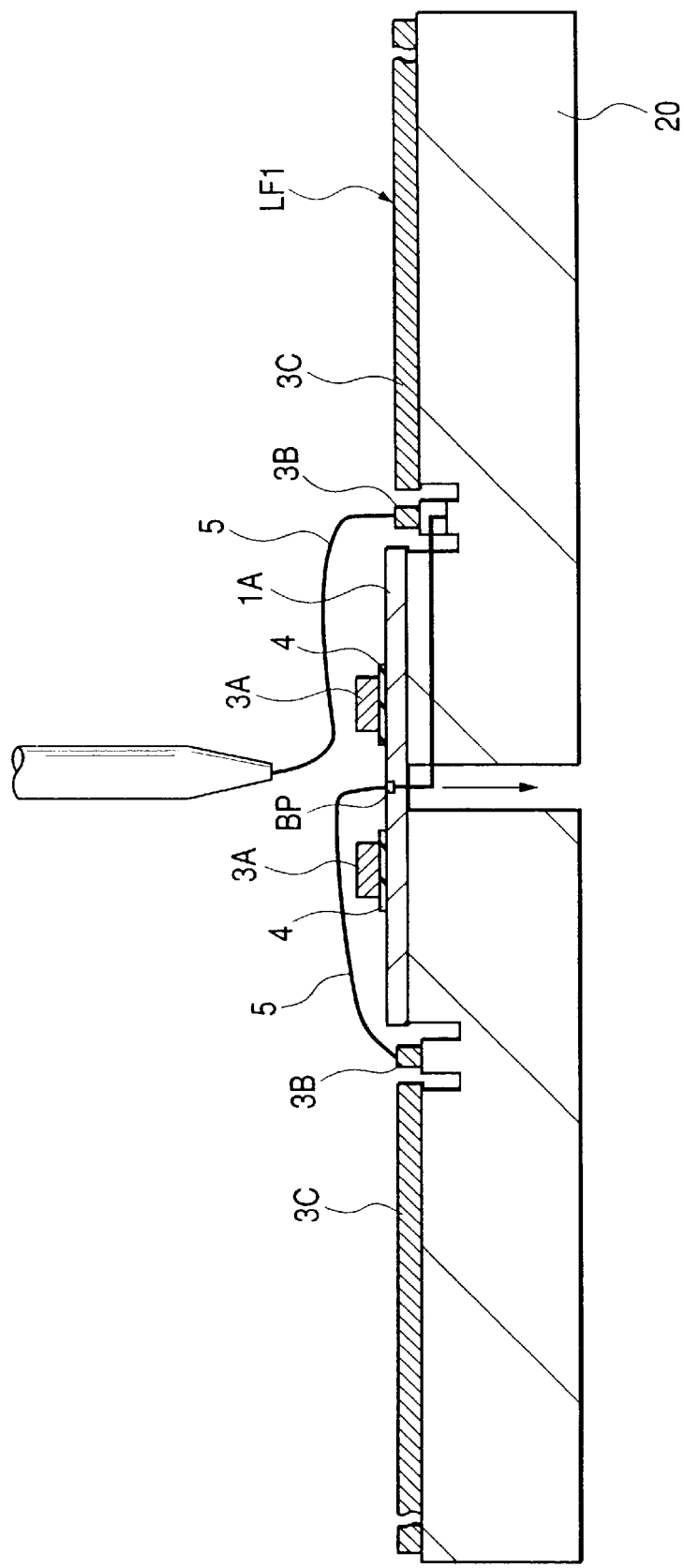
FIG. 27 is a cross-sectional view illustrating a method of manufacturing a semiconductor device according to a still further embodiment of the present invention.

As shown in FIG. 26 by way of example, the lengths of suspension leads 3A for supporting two chips 1A and 1B may be set shorter than those of the suspension leads 3A employed in the embodiment 1. An advantageous effect is obtained in that since an area for contact between the chip 1A and each lead 3A is reduced as compared with the embodiment 1 if done in this way, the areas of insulating films (4) interposed between the chip 1A and the suspension leads 3A are also reduced although the chips 1A and 1B are slightly degraded in stability, whereby the degree of moisture absorption of each insulating film (4) is reduced, and reflow crack resistance of a TSOP1 is improved.

Similarly, the shapes and lengths of the bus bar leads 3B may also be changed in such a range as not to impair the function of the bus bar leads 3B in the embodiments 2 and 3.

Further, a reverse bonding method may be adopted wherein when bus bar leads 3B (or leads 3C) of a lead frame LF and bonding pads BP of chips 1A and 1B are respectively connected by wires, one ends of the wires 5 are respectively connected to the surfaces of the bus bar leads 3B (or leads 3) (first bonding), and thereafter the other ends of the wires 5 are respectively connected to the surfaces of the bonding pads BP (second bonding). Since a loop height of each wire 5 can be lowered by doing so, the thickness of a TSOP can further be thinned.

The present invention is not limited to the TSOP and can also be applied to other resin encapsulation type semiconductor devices such as a TSOJ, etc., which are different in the shape of outer lead portions. Further, the chip is not necessarily limited to the DRAM. A chip may be used in which a memory LSI such as an SRAM, a flash memory or the like is formed.

Advantageous effects obtained by typical ones of the inventions disclosed by the present application will be described in brief as follows:

According to the present invention, a semiconductor device wherein two semiconductor chips are stacked on each other and sealed with a resin, can be reduced in manufacturing cost.

According to the present invention, the thinning of a semiconductor device wherein two semiconductor chips are stacked on each other and sealed with a resin, can be promoted.

What is claimed is:

1. A method of producing a semiconductor package comprising the steps of:
   (a) providing a first semiconductor chip, a second semiconductor chip and a lead frame of a plate shape having a first surface side and a second surface side opposite to said first surface side, each of said first and second semiconductor chips having a main surface, a rear surface opposite to said main surface, and an integrated circuit and bonding pads formed on said main surface, said lead frame having signal leads, fixed potential leads and a suspending lead for supporting said first and second semiconductor chips;
   (b) attaching said first semiconductor chip to said lead frame, such that said main surface of said first semiconductor chip is adhered to said second surface side of said suspending lead, and such that one end of said signal leads and said fixed potential leads are disposed at the vicinity of a side surface of said first semiconductor chip and are spaced from said first semiconductor chip;
   (c) electrically connecting said bonding pads of said first semiconductor chip to said signal leads and said fixed potential leads by first bonding wires respectively, such that one end of said first bonding wires are contacted with said first surface side of said signal leads and said fixed potential leads respectively;
   (d) after the step (c), attaching said second semiconductor chip to said lead frame with said first semiconductor chip, such that said rear surfaces of said first and second semiconductor chips are adhered to each other;
   (e) after the step (d), electrically connecting said bonding pads of said second semiconductor chip to said signal leads and said fixed potential leads by second bonding wires respectively, such that one end of said second bonding wires are contacted with said second surface side of said signal leads and said fixed potential leads respectively;
   (f) sealing said first and second semiconductor chips, said first and second bonding wires, inner lead portions of said signal leads and said fixed potential leads and a portion of said suspending lead by a resin member, outer lead portions of said signal leads and said fixed potential leads extending outwardly from said resin member.

2. A method of producing a semiconductor package according to claim 1, further comprising the steps of removing unnecessary portions of said lead frame and forming said outer lead portions of said signal leads and said fixed potential leads into a gull-wing shape.

3. A method of producing a semiconductor package according to claim 1, wherein each of said first and second semiconductor chips has a rectangular shape, wherein said bonding pads of said first and second semiconductor chips are arranged at a substantially central position of said main surface along longer edges of each of said first and second semiconductor chips, and wherein said first bonding wires cross over said suspending lead adhered to said main surface of said first semiconductor chip.

4. A method of producing a semiconductor package according to claim 1, wherein said suspending lead is disposed to cross shorter sides of said first semiconductor chip, and wherein a portion of said suspending lead overlapping with said first semiconductor chip is adhered to said main surface of said first semiconductor chip by an adhesive tape.

5. A method of producing a semiconductor package according to claim 2, wherein said resin member has a substantially rectangular shape in a plan view, wherein said suspending lead protrudes outwardly from a side surface of said resin member, and wherein the step of removing unnecessary portions of said lead frame includes cutting said suspending lead at a boundary of said side surface of said resin member.

* * * * *